United States Patent
Aoyagi et al.

(10) Patent No.: US 9,786,463 B2
(45) Date of Patent: Oct. 10, 2017

(54) ELECTRONIC COMPONENT, CONDUCTIVE PASTE, AND METHOD FOR MANUFACTURING AN ELECTRONIC COMPONENT

(75) Inventors: Takuya Aoyagi, Tsuchiura (JP); Takashi Naito, Funabashi (JP); Yuji Hashiba, Narita (JP); Kei Yoshimura, Inzai (JP); Shinichi Tachizono, Narita (JP)

(73) Assignees: HITACHI, LTD., Tokyo (JP); HITACHI CHEMICAL COMPANY, LTD., Tokyo (JP)

( * ) Notice: Subject to any disclaimer, the term of this patent is extended or adjusted under 35 U.S.C. 154(b) by 146 days.

(21) Appl. No.: 13/581,178

(22) PCT Filed: Feb. 17, 2011

(86) PCT No.: PCT/JP2011/053417
§ 371 (c)(1),
(2), (4) Date: Aug. 24, 2012

(87) PCT Pub. No.: WO2011/118300
PCT Pub. Date: Sep. 29, 2011

(65) Prior Publication Data
US 2012/0318559 A1 Dec. 20, 2012

(30) Foreign Application Priority Data
Mar. 23, 2010 (JP) .................. 2010-065579

(51) Int. Cl.
*H01J 11/12* (2012.01)
*H01B 1/22* (2006.01)
(Continued)

(52) U.S. Cl.
CPC ............... *H01J 11/12* (2013.01); *C03C 8/18* (2013.01); *H01B 1/22* (2013.01); *H01J 9/02* (2013.01);
(Continued)

(58) Field of Classification Search
CPC ...................................................... H01B 1/02
(Continued)

(56) References Cited

U.S. PATENT DOCUMENTS 4,724,172 A * 2/1988 Mosser .................. C23C 22/74
106/14.12
7,294,594 B2 * 11/2007 Kawamoto ............. C03C 3/083
501/27

(Continued)

FOREIGN PATENT DOCUMENTS

CN 101503277 A 8/2009
JP 05-298917 A 11/1993
(Continued)

OTHER PUBLICATIONS

Office Action issued in corresponding Chinese Patent Application No. 201180010450.3 on Sep. 16, 2014, consisting of 26 pp. (English translation provided).
(Continued)

*Primary Examiner* — William Young
(74) *Attorney, Agent, or Firm* — Volpe and Koenig, P.C.

(57) ABSTRACT

The conductive paste contains the following dispersed in a binder resin dissolved in a solvent: a plurality of particles comprising aluminum and/or an aluminum-containing alloy; and an oxide-comprising powder. The oxide contains vanadium with a valence no greater than 4 and a glass phase. In the method for manufacturing an electronic component, the conductive paste is applied to a substrate and fired, forming electrode wiring. The electronic component is provided with electrode wiring that has: a plurality of particles comprising aluminum and/or an aluminum-containing alloy; and an oxide affixing the particles to a substrate. The oxide contains vanadium with a valence no greater than 4. A compound layer containing vanadium and aluminum is formed on the surfaces of the particles, and the vanadium in the compound (Continued)

layer includes vanadium with a valence no greater than 4. This results in an electrode wiring with high reliability and water resistance.

9 Claims, 9 Drawing Sheets

(51) Int. Cl.

| | |
|---|---|
| H01J 9/02 | (2006.01) |
| H01J 11/22 | (2012.01) |
| H01L 31/0224 | (2006.01) |
| H05K 1/09 | (2006.01) |
| C03C 8/18 | (2006.01) |
| H05K 3/46 | (2006.01) |

(52) U.S. Cl.
CPC ...... *H01J 11/22* (2013.01); *H01L 31/022425* (2013.01); *H05K 1/092* (2013.01); *H01J 2211/225* (2013.01); *H05K 3/4629* (2013.01); *H05K 2201/0224* (2013.01); *Y02E 10/50* (2013.01)

(58) Field of Classification Search
USPC ......................................................... 252/514
See application file for complete search history.

(56) References Cited

U.S. PATENT DOCUMENTS

| | | | |
|---|---|---|---|
| 2009/0056798 A1* | 3/2009 | Merchant et al. ............ 136/256 |
| 2009/0199897 A1 | 8/2009 | Naito et al. | |
| 2010/0001640 A1* | 1/2010 | Kim et al. .................... 313/582 |
| 2010/0151323 A1 | 6/2010 | Naito et al. | |
| 2010/0180934 A1 | 7/2010 | Naito et al. | |
| 2015/0028333 A1 | 1/2015 | Fujieda et al. | |

FOREIGN PATENT DOCUMENTS

| | | |
|---|---|---|
| JP | 07-058369 A | 3/1995 |
| JP | 07-073731 A | 3/1995 |
| JP | 2009-209032 A | 9/2009 |
| JP | 2010-161331 A | 7/2010 |
| JP | 2010-184852 A | 8/2010 |
| WO | 2010-109903 A1 | 9/2010 |
| WO | 2010-109905 A1 | 9/2010 |

OTHER PUBLICATIONS

Giuli, Gabriele, et al. "V oxidation state and coordination number in silicate glasses by XAS", American Mineralogist, vol. 89, pp. 1640-1646, 2004.

Notice of Reasons for Rejection issued in related Japanese Patent Application No. 2014-043774 on Jan. 20, 2015, consisting of 6 pp. (English translation provided).

Sharipova, N.S. and Ksandopulo, G.I., "Phase and structural transformations and mechanism of propagation of self-propagating high-temperature synthesis in a V2O5—Al mixture, Combustion, Explosion, and Shock Waves", vol. 33, No. 6, p. 659-668 (1997).

Chinese Notification of reasons for refusal, dated in Apr. 14, 2015. Application No. CN201180010450.3.

Hoppe et al., "Structure of V2O5—P2O5 glasses by X-ray and neutron diffraction," Journal of Non-Crystalline Solids 358 (2012) 328-336.

* cited by examiner

ELECTRONIC COMPONENT, CONDUCTIVE PASTE, AND METHOD FOR MANUFACTURING AN ELECTRONIC COMPONENT

TECHNICAL FIELD

The present invention relates to an electronic component provided with an electrode wire, a conductive paste used to form the electrode wire, and a method for manufacturing the electronic component.

BACKGROUND ART

An electrode wire is formed in a solar battery cell, or in an electronic component of a plasma display (PDP), a liquid crystal display (LCD), a ceramic multi-layer wire substrate, or the like. Such an electrode wire is formed, using a conductive paste. Silver (Ag) or aluminum (Al) is used as metal particles for a conductive paste. An electrode wire is formed by firing a conductive paste in the atmosphere at a high temperature. Herein, in addition to metal particles, the conductive paste contains glass particles, and the glass particles become soft and flow when heated to a temperature higher than or equal to the softening point of the glass particles during firing of the conductive paste so that an electrode wire becomes densified and firmly adhered to a substrate.

A conductive paste with metal particles of aluminum may have a high resistance due to an oxide film formed on the surface of aluminum, and a method for improving the sintering of metal particles and lowering the resistance of an electrode wire low by adding vanadium (V) or vanadium oxide ($V_2O_5$) is presented (see Patent Literature 1 and the like). Further, a method for improving the anti-oxidation and lowering resistance by adding carbon (C), germanium (Ge), tin (Sn), a hydrogenated metal compound, a metal phosphide compound, or the like is presented (see Patent Literature 2, etc.).

BACKGROUND ART DOCUMENT

Patent Literature

Patent Literature 1: JP H07-73731 A
Patent Literature 2: JP H05-298917 A

DISCLOSURE OF THE INVENTION

Problems to be Solved by the Invention

Lowering resistance has been promoted for a conductive paste with metal particles of aluminum, and such a conductive paste has been used for an electrode wire of an electronic component, for example, an electrode wire of a solar battery cell, thereby having contributed to improving the performance of a solar battery cell (electronic component).

On the other hand, for an electronic component of a solar battery cell or the like, it is required to reduce time degradation in performance, attain a long life, and obtain a high reliability. Degradation in performance (increase in resistance) of an electrode wire is a kind of such degradation in performance. It proved that this is caused by that moisture in the atmosphere reacts with the film oxide of aluminum and aluminum hydroxide is thereby created. It is thought that, if the metal particles of aluminum are covered by a densified member in order that moisture in the atmosphere does not reach the film oxide of aluminum, water resistance (moisture resistance) improves and degradation in the performance of an electrode wire can be reduced.

In this situation, an object of the present invention is to provide an electronic component provided with an electrode wire with high water resistance and high reliability, a conductive paste, and a method for manufacturing the electronic component.

Means for Solving the Problem

In order to attain the above-described object, the present invention provides an electronic component that includes an electrode wire containing a plurality of particles formed from aluminum (Al) and/or an alloy containing aluminum, and an oxide for fixing the particles to a substrate, wherein the oxide contains vanadium (V) with a valence of 4 or less.

Further, the invention provides a conductive paste in which a plurality of particles formed from aluminum and/or an alloy containing aluminum and powder formed from an oxide are dispersed in a binder resin dissolved in a solvent, wherein the oxide contains a glass phase and vanadium with a valence of 4 or less.

Still further, the invention provides a method for manufacturing an electronic component, the method includes the steps of: coating a substrate with a conductive paste in which a plurality of particles formed from aluminum and/or an alloy containing aluminum, and powder formed from an oxide containing a glass phase and vanadium with a valence of 4 or less, are dispersed in a binder resin dissolved in a solvent; and forming an electrode wire by firing the coated conductive paste.

Advantage of the Invention

According to the invention, it is possible to provide an electronic component provided with an electrode wire with high water resistance and high reliability, a conductive paste, and a method for manufacturing the electronic component.

EMBODIMENTS FOR CARRYING OUT THE INVENTION

Figure 1:
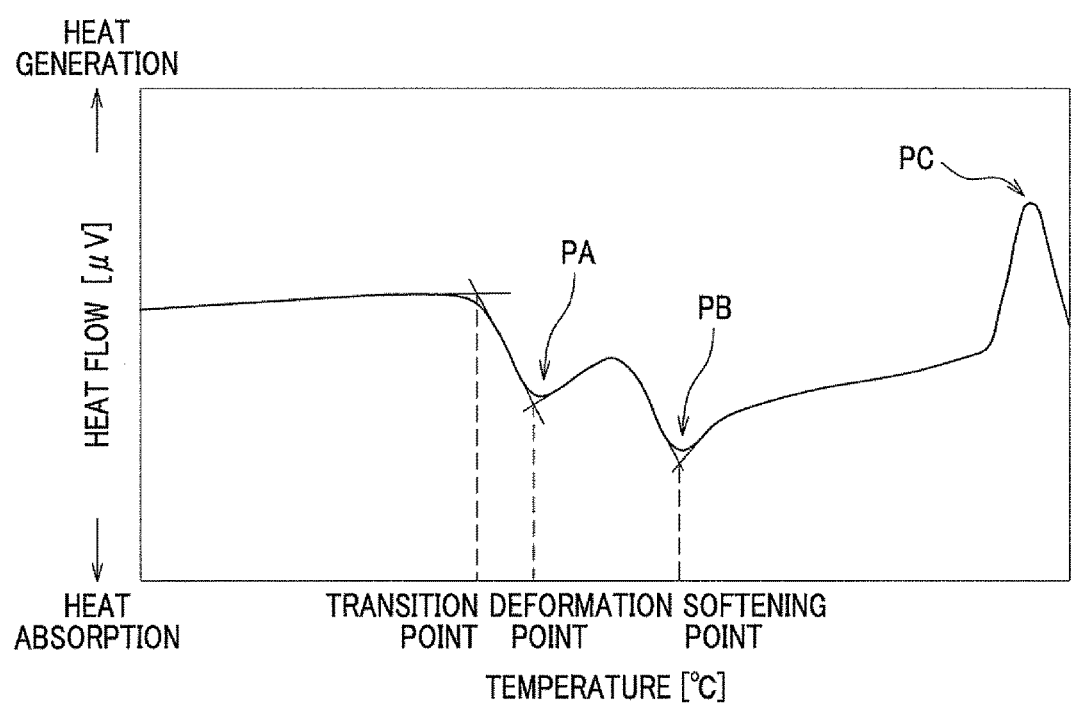
FIG. 1 shows an example of a DTA curve obtained by DTA measurement of a glass composition (powder of oxide)

Embodiments according to the present invention will be described below in detail with reference to the drawings, as appropriate. The same symbol will be assigned to an element common to respective drawings, and overlapping description will be omitted. Further, the invention is not limited to the each of the plural embodiments describe below, and combination may be made, as appropriate.

First Embodiment

[Discussion about Composition of Glass Composition (Powder of Oxide) of Conductive Paste]

In a first embodiment, discussion was made on the composition of a glass composition (powder of oxide) of a conductive paste.

As shown in Table 1, in the first embodiment, 35 kinds of glass compositions (powder of oxide) of conductive pastes were prepared, that are Examples 1 to 30 and Comparative Examples 1 to 5, conductive pastes were prepared using the respective glass compositions, electrode wires were prepared using the respective conductive pastes, and various characteristics were evaluated. In preparing the glass compositions (powder of oxide), the composition of a glass system was changed for the respective Examples 1 to 30 and Comparative Examples 1 to 5. Further, as evaluated characteristics, measurement of characteristic temperature was performed on the glass compositions (powder of oxide), and tight adhesiveness test (peel test), a water resistance test, and measurement of the specific resistance were performed on the electrode wires.

TABLE 1

| Example | Glass System | Transition Point (° C.) | Tight Adhesiveness Test | Water Resistance Test |
|---|---|---|---|---|
| 1 | V—P—Ba—O System | 340 | S | S |
| 2 | V—P—Sb—O System | 267 | S | S |
| 3 | V—P—Sb—W—O System | 335 | S | S |
| 4 | V—P—Sb—K—O System | 320 | S | S |
| 5 | V—P—Sb—Ba—O System | 315 | S | S |
| 6 | V—P—Sb—Ba—Zn—W—O System | 396 | S | A |
| 7 | V—P—Sb—Mn—Na—K—Ba—Te—O System | 380 | S | A |
| 8 | V—P—Mn—Na—K—Ba—Zn—W—O System | 355 | S | S |
| 9 | V—P—Mn—Ba—Zn—W—O System | 375 | S | S |
| 10 | V—P—Fe—Li—O System | 238 | S | S |
| 11 | V—P—Fe—O System | 290 | S | S |
| 12 | V—P—Fe—Ba—Zn—W—O System | 382 | S | A |
| 13 | V—P—Fe—Ba—O System | 335 | S | S |
| 14 | V—P—Fe—W—Ba—O System | 389 | S | A |
| 15 | V—P—Fe—Zn—Ba—O System | 394 | S | A |
| 16 | V—P—Bi—Ba—Zn—W—O System | 402 | A | A |
| 17 | V—P—Li—O System | 221 | S | S |
| 18 | V—P—Li—Ba—O System | 232 | S | S |
| 19 | V—P—Ba—Zn—O System | 348 | S | S |
| 20 | V—P—Ba—Zn—W—O System | 353 | S | S |
| 21 | V—P—Ba—Te—O System | 405 | A | A |
| 22 | V—P—Ba—Te—Cu—O System | 410 | A | A |
| 23 | V—P—Ba—Zn—W—B—O System | 488 | A | A |
| 24 | V—P—Ba—W—Mo—K—O System | 486 | A | A |
| 25 | V—P—Ba—W—Cu—O System | 502 | B | A |
| 26 | V—P—Ba—Zn—Cu—B—O System | 550 | B | A |
| 27 | V—P—Fe—Ba—W—Cu—O System | 375 | S | S |
| 28 | V—P—Fe—Li—Ba—W—O System | 250 | S | S |
| 29 | V—P—Ba—Te—K—W—O System | 267 | S | S |
| 30 | V—P—Sb—Ba—Te—K—W—O System | 282 | S | S |
| Comparative Example 1 | P—K—Ba—Zn—W—B—O System | 528 | B | B |
| Comparative Example 2 | P—K—Ba—Zn—Mo—B—O System | 502 | B | B |
| Comparative Example 3 | P—Fe—K—Ba—Zn—W—B—O System | 493 | B | B |
| Comparative Example 4 | Pb—B—Si—Ti—Zn—Al—O System | 375 | S | B |
| Comparative Example 5 | Bi—B—Si—Ba—Zn—O System | 413 | A | B |

(1-1 Preparation of Glass Composition (Powder of Oxide))

Glass compositions (powder of oxide) having the compositions of glass systems shown in Examples 1 to 30 and Comparative Examples 1 to 5 in Table 1 were prepared. The compositions of glass systems shown in Examples 1 to 30, Comparative Examples 1 to 3, and Comparative Example 5 were not made contain lead (Pb), which is a material prohibited by RoHS instruction. Only in Comparative Example 4, lead was made contained as a main component.

Vanadium (V) and phosphorus (P) are used as main components of the respective compositions of glass systems in Examples 1 to 30. Further, in addition to vanadium and phosphorus, barium (Ba) also is used as a main component in Example 1, Examples 19 to 26, and Example 29.

In Example 1, no additive was added to the main components of vanadium, phosphorus, and barium.

In Example 2, antimony (Sb) was added as an additive to the main components of vanadium and phosphorus.

In Example 3, antimony and tungsten (W) were added as additives to the main components of vanadium and phosphorus.

In Example 4, antimony and potassium (K) were added as additives to the main components of vanadium and phosphorus.

In Example 5, antimony and barium were added as additives to the main components of vanadium and phosphorus.

In Example 6, antimony, barium, zinc, and tungsten were added as additives to the main components of vanadium and phosphorus.

In Example 7, antimony, manganese (Mn), sodium (Na), potassium, barium, and tellurium (Te) were added as additives to the main components of vanadium and phosphorus.

In Example 8, manganese, sodium, potassium, barium, zinc, and tungsten were added as additives to the main components of vanadium and phosphorus.

In Example 9, manganese, barium, zinc, and tungsten were added as additives to the main components of vanadium and phosphorus.

In Example 10, iron (Fe) and lithium (Li) were added as additives to the main components of vanadium and phosphorus.

In Example 11, iron was added as an additive to the main components of vanadium and phosphorus.

In Example 12, iron, barium, zinc, and tungsten were added as additives to the main components of vanadium and phosphorus.

In Example 13, iron and barium were added as additives to the main components of vanadium and phosphorus.

In Example 14, iron, tungsten, and barium were added as additives to the main components of vanadium and phosphorus.

In Example 15, iron, zinc, and barium were added as additives to the main components of vanadium and phosphorus.

In Example 16, bismuth (Bi), barium, zinc, and tungsten were added as additives to the main components of vanadium and phosphorus.

In Example 17, lithium was added as an additive to the main components of vanadium and phosphorus.

In Example 18, lithium and barium were added as additives to the main components of vanadium and phosphorus.

In Example 19, zinc was added as an additive to the main components of vanadium, phosphorus, and barium.

In Example 20, zinc and tungsten were added as additives to the main components of vanadium, phosphorus, and barium.

In Example 21, tellurium was added as an additive to the main components of vanadium, phosphorus, and barium.

In Example 22, tellurium and copper (Cu) were added as additives to the main components of vanadium, phosphorus, and barium.

In Example 23, zinc, tungsten, and boron (B) were added as additives to the main components of vanadium, phosphorus, and barium.

In Example 24, tungsten, molybdenum (Mo), and potassium were added as additives to the main components of vanadium, phosphorus, and barium.

In Example 25, tungsten and copper were added as additives to the main components of vanadium, phosphorus, and barium.

In Example 26, zinc, copper, and boron were added as additives to the main components of vanadium, phosphorus, and barium.

In Example 27, iron, barium, tungsten, and copper were added as additives to the main components of vanadium and phosphorus.

In Example 28, iron, lithium, barium, and tungsten were added as additives to the main components of vanadium and phosphorus.

In Example 29, tellurium, potassium, and tungsten were added as additives to the main components of vanadium, phosphorus, and barium.

In Example 30, antimony, barium, tellurium, potassium, and tungsten were added as additives to the main components of vanadium and phosphorus.

In Comparative Examples 1 to 5, vanadium was not added to the composition of a glass system. Phosphorus was used as the main component in Comparative Examples 1 to 3, lead was used as the main component in Comparative Example 4, and bismuth was used as the main component in Comparative Example 5.

In Comparative Example 1, potassium, barium, zinc, tungsten, and boron were added as additives to the main component of phosphorus.

In Comparative Example 2, potassium, barium, zinc, molybdenum, and boron were added as additives to the main component of phosphorus.

In Comparative Example 3, iron, potassium, barium, zinc, tungsten, and boron were added as additives to the main component of phosphorus.

In Comparative Example 4, boron, silicon (Si), titanium (Ti), zinc, and aluminum (Al) were added as additives to the main component of lead. Incidentally, in Comparative Example 4, a commercially available lead system glass was used.

In Comparative Example 5, boron, silicon, barium, and zinc were added to the main component of bismuth. Incidentally, in Comparative Example 5, a commercially available bismuth system glass was used.

As the raw material compound of the vanadium component, vanadium pentoxide ($V_2O_5$) was used. As the raw material compound of the phosphorus component, phosphorus pentoxide ($P_2O_5$) was used. As the raw material compound of the barium component, barium carbonate ($BaCO_3$) was used. As the raw material compound of the lithium component, lithium carbonate ($Li_2CO_3$) was used. As the raw material compound of the sodium component, sodium carbonate ($Na_2CO_3$) was used. As the raw material compound of the potassium component, potassium carbonate ($K_2CO_3$) was used. As the raw material compound of the antimony component, antimony trioxide ($Sb_2O_3$) was used, however, antimony tetraoxide ($Sb_2O_4$) may be used. As the raw material compound of the manganese component, manganese dioxide ($MnO_2$) was used, however, manganese oxide (MnO) may be used. As the raw material compound of the iron component, diiron trioxide ($Fe_2O_3$) was used, however, iron oxide (FeO), triiron tetraoxide ($Fe_3O_4$) or the like may be used. As the raw material compound of the bismuth component, bismuth trioxide ($Bi_2O_3$) was used. As the raw material compound of the zinc component, zinc oxide (ZnO) was used. As the raw material compound of the tungsten component, tungsten trioxide ($WO_3$) was used. As the raw material compound of the tellurium component, tellurium dioxide ($TeO_2$) was used. As the raw material compound of the copper component, copper oxide (CuO) was used. As the raw material compound of the molybdenum component, molybdenum trioxide ($MoO_3$) was used.

As the raw material compound of the boron component, boron oxide ($B_2O_3$) was used.

Further, as the raw material compound of the barium component, barium phosphate ($Ba(PO_3)_2$) may be used, and as the raw material compound of the iron component, iron phosphate ($FePO_4$) may be used. As these raw material compounds also include phosphorus, it is desirable to adjust the additive amount of phosphorus pentoxide ($P_2O_5$) to become the raw material compound of the phosphorus component, taking into account the composition ratio of phosphorus in a glass composition.

The glass compositions were concretely prepared in the following procedure, using the above-described respective raw material compounds.

First, raw material compounds in a powder form were mixed so that the compositions of the glass systems become predetermined compositions in the respective Examples 1 to 30 and Comparative Examples 1 to 3. Then, each mixed powder was put in a platinum crucible, and was heated and melt, using an electric furnace. As heating conditions, the mixed powder was heated at a temperature rise rate of 5 to 10° C./min up to 1000 to 1100° C., and this state with the heating temperature 1000 to 1100° C. was maintained for two hours. During this maintenance, the fused material was agitated such as to become uniform so that a uniform glass composition can be obtained.

Then, the platinum crucible was taken, with the high temperature thereof left as it is, out from the electric furnace, and the fused material was flowed onto a stainless steel plate which had been heated in advance to 200-300° C. The fused material was rapidly cooled to be vitrified, and was solidified to be a glass composition in a bulk form. The bulk formed glass composition was crushed using a stamp mill, and thus powder (powder of oxide) of a glass composition with a particle diameter approximately 1 to 3 μm was prepared.

In Comparative Example 4, a commercially available lead system glass was used as a glass composition in a bulk form, was crushed with a stamp mill, and powder (powder of oxide) of the glass composition was thus prepared. In Comparative Example 5, a commercially available bismuth system glass was used as a glass composition in a bulk form, was crushed with a stamp mill, and powder (powder of oxide) of the glass composition was thus prepared.

(1-2 Measurement of Characteristic Temperature of Glass Composition)

The characteristic temperatures of the glass compositions respectively prepared in Examples 1 to 30 and Comparative Examples 1 to 5 were measured. For the measurement of the characteristic temperatures, a differential thermal analysis (DTA) device (produced by SHINKU RIKO KK, model No. DT-1500) was used. As a reference sample, α-alumina ($Al_2O_3$) was used, and both the mass of the reference sample and the mass of each of the prepared materials (powder of respective glass compositions in Examples 1 to 30 and Comparative Examples 1 to 5) were set to 1 g. In the measurement, the temperatures of the reference sample and each prepared sample were increased in the atmospheric environment at a temperature-increase rate of 5° C./min.

FIG. 1 shows an example of a DTA curve obtained by measurement (DTA measurement) of the characteristic temperatures of a glass composition. With the DTA curve in FIG. 1, a first heat absorption peak PA, a second heat absorption peak PB, and a heat generation peak PC were measured. The starting temperature of the first heat absorption peak PA (the temperature at which the tangent line of the DTA curve before the start of the first heat absorption peak PA and the tangent line of the DTA curve where the DTA curve falls in the first half of the first heat absorption peak PA intersect with each other, by a tangent method) was defined as the transition point of the glass composition. Measurement of the characteristic temperatures (DTA measurement) was performed respectively for Examples 1 to 30 and Comparative Examples 1 to 5, and the transition point of a glass composition was obtained from a DTA curve as a measurement result. Obtained transition points are also described in Table 1. When the temperature becomes higher than or equal to the transition point, the rigidity and the viscosity of a glass composition drops, the glass composition softens, and the flowing characteristic increases. It is thought that. In order to cover metal particles of aluminum with densification by a glass composition so that the water resistance and the moisture resistance improve, the transition point should be low as much as possible.

In Comparative Examples 1 to 3, (main component of phosphorus), the transition points were 528° C., 502° C., and 493° C., and were approximately 500° C. Among Examples 1 to 30, a transition point of 500° C. or lower was attained in Examples 1 to 24 and Examples 27 to 30.

The transition point was 375° C. in Comparative Example 4 (main component of lead), and the transition point was 413° C. in Comparative Example 5 (main component of bismuth). As these are known as a glass composition with a high flowing characteristic, it is thought that the transition point should be 4 or less 400° C. in order to ensure a high flowing characteristic. Among Examples 1 to 30, a transition point 4 or less 400° C. was attained in Examples 1 to 15, Examples 17 to 20, and Examples 27 to 30. Further, a transition point lower than or equal to 300° C. was attained in Example 2, Example 10, Example 11, Example 17, Example 18, and Examples 28 to 30.

Incidentally, the peak temperature of the first heat absorption peak PA (the temperature at which the tangent line of the DTA curve where the DTA curve falls in the first half of the first heat absorption peak PA and the tangent line of the DTA curve where the DTA curve rises in the second half of the first heat absorption peak PA interest with each other, by the tangent method) can be defined as the deformation point of the glass composition, as shown in FIG. 1. Further, the peak temperature of the second heat absorption peak PB (the temperature at which the tangent line of the DTA curve where the DTA curve falls in the first half of the second heat absorption peak PB and the tangent line of the DTA curve where the DTA curve rises in the second half of the second heat absorption peak PB interest with each other, by the tangent method) can be defined as the softening point of the glass composition, as shown in FIG. 1. At the heat generation peak PC, crystallization of the glass composition occurs. In this crystallization, crystal phases of minute crystals are generated in a state of dispersion in the glass phase of the glass composition.

(1-3 Preparation of Conductive Paste)

As metal particles to be contained in the conductive pastes, two kinds of aluminum particles which are a Particle Group A with an average particle diameter (D50) of 1 μm and a Particle Group B with an average particle diameter (D50) of 5 μm were prepared. First, aluminum was melt, and aluminum particles in a spherical shape were prepared by a water atomizing method. Particles with a diameter smaller than 0.5 μm were removed from these aluminum particles by a screen, particles with a diameter larger than or equal to 1.5 μm were removed by a screen, and the group of the remaining particles was categorized as Particle Group A. Particle Group A had an average particle diameter (D50) of 1 μm, and had a volume ratio larger than or equal to approximately 95% in a range of particle diameter larger than or equal to 0.5 μm and smaller than 1.5 μm. From the particles, removed by the previous screening, with a particle diameter larger than or equal to 1.5 μm, particles with a particle diameter greater than or equal to 8 μm were removed by a screen, and the group of the remaining particles was categorized as Particle Group B. Particle Group B had an average particle diameter (D50) of 5 μm, and had a volume ratio larger than or equal to approximately 95% in a range of particle diameter larger than or equal to 1.5 μm and smaller than 8 μm.

The aluminum particles of Particle Group A and the aluminum particles of Particle Group B were mixed and used such that the aluminum particles of Particle Group A is in 50 weight % and the aluminum particles of Particle Group B is in 50 weight %, that is, the mixture ratio of Particle Group A and Particle Group B is 1:1.

To 100 weight parts of the mixed aluminum particles, 10 weight parts of particles of the respective glass composition (oxide) in Examples 1 to 30 and Comparative Examples 1 to 5 were mixed, and further to these mixtures, a binder resin and a solvent were added and mixed for kneading. The binder resin dissolved in the solvent, the aluminum particles and the powder of the glass compositions (oxide) dispersed in the binder resin having dissolved in the solvent, and the respective conductive pastes were thereby completed. Ethyl cellulose was used as the binder resin, and α-terpineol was used as the solvent.

(1-4 Forming Electrode Wire)

The conductive pastes in Examples 1 to 30 and Comparative Examples 1 to 5 were coated on respective multi-crystal silicon substrates used for an electronic component such as a solar battery cell by a screen print method. After coating, the conductive pastes were dried by heating in the atmosphere at a temperature of 150° C. for several minutes. Thereafter, each of the conductive pastes was subjected to heat treatment by an electric furnace in the atmosphere at a firing temperature of 850° C. for 2 seconds, and thus each electrode wire was fired and completed. All of the film thicknesses of the fired electrode wires were approximately 40 μm.

(1-5 Characteristic of Electrode Wire, Specific Resistance Measurement)

The specific resistance of the completed electrode wire in each of Examples 1 to 30 and Comparative Examples 1 to 5 was measured by the four probe method. In the specific resistance measurement, the electric resistance and the film thickness of an electrode wire were measured, and the specific resistance was computed, based on the electric resistance and the film thickness. The values of the specific resistances of electrode wires in Examples 1 to 30 were approximately the same as or smaller than the values of the specific resistances of electrode wires in Comparative Example 4 (using a glass composition of lead system) and Comparative Example 5 (using a glass composition of bismuth system).

(1-6 Characteristic of Electrode Wire, Tight Adhesiveness Test (Peel Test))

The strength of adhesion (tight adhesiveness) of the completed electrode wire to the substrate was evaluated by a peel test respectively in Examples 1 to 30 and Comparative Examples 1 to 5. In the peel test, a commercially available adhesive cellophane tape was stuck to the electrode wire and then peeled off. The electrode wire after the peeling off was evaluated by observation. As evaluation criteria, 'B' was assigned to a case that almost all aluminum particles were peeled off and the electrode wire became into a broken state; 'A' was assigned to a case that a part of aluminum particles were slightly peeled off but the electrode wire did not become into a broken state; and 'S' was assigned a case that aluminum particles were not peeled off at all. As shown in Table 1, as a result of the peel test, Examples 1 to 15, Examples 17 to 20, Examples 27 to 30, and Comparative Example 4 were evaluated 'S'; Example 16, Examples 21 to 24, and Comparative Example 5 were evaluated 'A'; and Example 25, Example 26, and Comparative Examples 1 to 3 were evaluated 'B'.

In Table 1, in comparison between the transition points and the result of tight adhesiveness test (peel test), evaluation was 'S' in a case that the transition point is 400° C. or lower; evaluation was 'A' in a case that the transition point exceeded 400° C. and was approximately equal to 500° C. or lower; and evaluation was 'B' in a case that the transition point exceeded 500° C. The lower the transition point is, the softening and flowing characteristics of the glass composition in firing (firing temperature) improve, and the glass composition becomes able to easily cover the surface of aluminum particles. When the surface of aluminum particles is covered by the glass composition, as the glass composition is inevitably disposed between adjacent aluminum particles, the glass composition acts as an adhesive agent to be able to firmly bond the adjacent aluminum particles to each other. Further, when the surface of the aluminum particles is covered by the glass composition, as the glass composition is inevitably disposed between the substrate and the aluminum particles adjacent to the substrate, the glass composition acts as an adhesive agent to be able to firmly bond the adjacent aluminum particles to the substrate. Accordingly, it is thought that the lower the transition point was, the higher tight adhesiveness was obtained in the tight adhesiveness test (peel test).

(1-7 Characteristic of Electrode Wire, Water Resistance Test)

As a water resistance test, an acceleration test of the respective electrode wires in Examples 1 to 30 and Comparative Examples 1 to 5 was performed such that the electrode wires were left in an environment with conditions of a temperature of 85° C. and a moisture of 85% for 1000 hours. As evaluation criteria, a case that the electrode wire changed into a black color after the test was evaluated 'B', a case that the color of the electrode wire slightly changed was evaluated 'A', and a case that the color little changed was evaluated 'S'. As shown in Table 1, as a result of the water resistance test, Examples 1 to 5, Examples 8 to 11, Example 13, Examples 17 to 20, and Examples 27 to 30 were evaluated 'S'. Example 6, Example 7, Example 12, Examples 14 to 16, and Examples 21 to 26 were evaluated 'A'. Comparative Examples 1 to 5 were evaluated 'B'. It proved that Examples 1 to 30 are higher in water resistance, compared with Comparative Examples 1 to 5.

By comparison between the result of the tight adhesiveness test and the result of the water resistance test in Examples 1 to 30, it proved that when evaluation by the water resistance test is 'S', evaluation by the tight adhesiveness test is also 'S'. In reverse, when evaluation by the tight adhesiveness test is 'S', evaluation by the water resistance test is 'S' or 'A'. From this, it is thought that, in Examples 1 to 30, evaluation 'S' by the water resistance test and evaluation 'S' by the tight adhesiveness test are closely related to each other.

In Examples 1 to 30, by comparison of the transition points and the result of the water resistance test, it proved that if the transition point is 380° C. or higher, evaluation by the water resistance test is 'A', and if the transition point is lower than 380° C., evaluation by the water resistance test is 'S'. From this, it is thought that, in Examples 1 to 30, a transition point and the result of the water resistance test are closely related to each other, and the lower the transition point is, the more the water resistance improves.

Further, as characteristics of the glass composition alone, even though Examples 1 to 30 are lower in water resistance compared with Comparative Example 4 (lead system glass) and Comparative Example 5 (bismuth system glass), it proved that, when the glass composition is mixed with aluminum particles, fired as a conductive paste, and an electrode wire is prepared with the fired conductive paste, the electrode wire can be prepared to be higher in water resistance in Examples 1 to 30, compared with Comparative Example 4 (lead system glass) and Comparative Example 5 (bismuth system glass). From this, it is thought that, while it is essential to cover aluminum particles with a densified film to obtain a high water resistance, this densified film is not a glass composition alone but is formed by presence of the glass composition and aluminum particles.

In Example 25 and Example 26, evaluation by the tight adhesiveness test was 'B', and evaluation by the water resistance test was 'A'. The respective transition points in Example 25 and Example 26 were 502° C. and 550° C. exceeding 500° C., and it is thought that the glass composition did not cover the surface of aluminum particles enough to bond the aluminum particles to the substrate. It is thought that the evaluation by the water resistance test was 'A' nevertheless because, even by covering the aluminum particles with the glass composition in an amount smaller than an amount necessary for adhesion, thin but densified films were formed by the aluminum particles and the glass composition on the surfaces of aluminum particles to thereby improve the water resistance.

Figure 2:
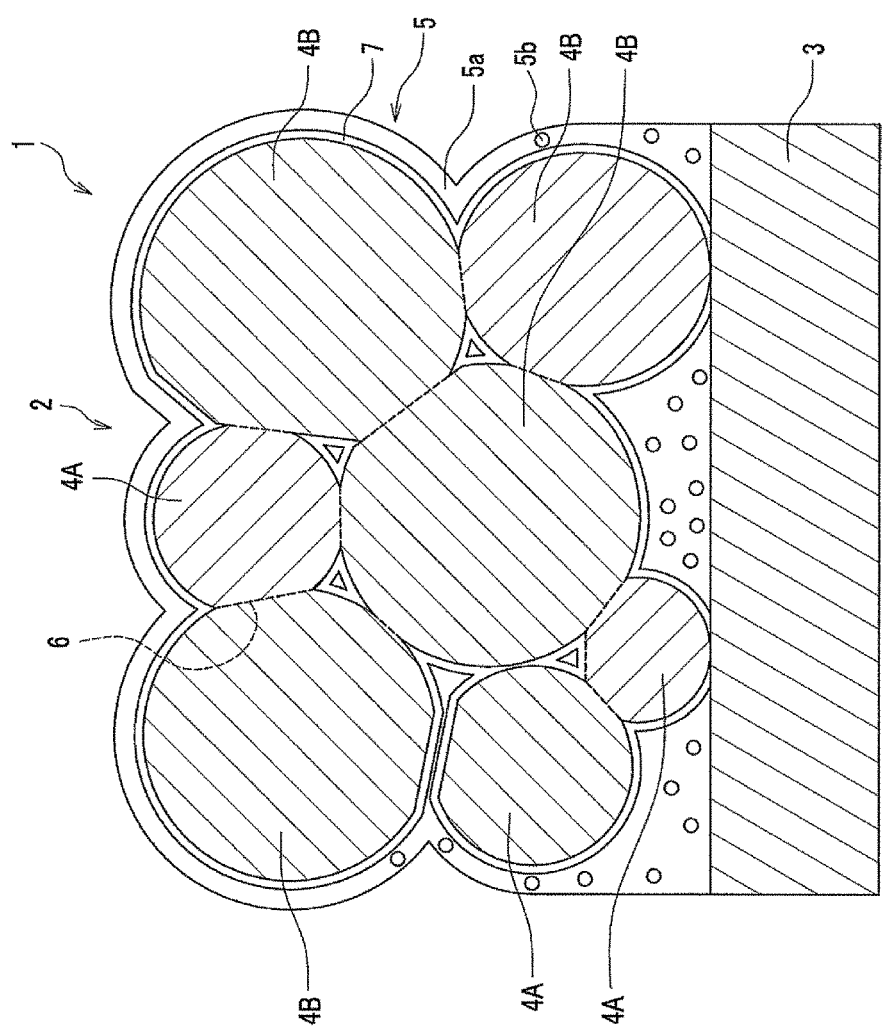
FIG. 2 is a part of a cross-sectional view of an electrode wire provided with an electronic component according to a first embodiment of the present invention.

FIG. 2 is a part of a cross-sectional view of an electrode wire 2 provided with an electronic component 1 according to the first embodiment of the present invention. This cross-sectional view is based on a result of observation of an electrode wire 2 prepared in one of Examples 1 to 30, Example 10 for example, using a scanning electronic microscope-energy divergence X ray analysis device (SEM-EDX).

The electronic component 1 includes a silicon substrate 3 and an electrode wire 2 bonded to the silicon substrate 3. The electrode wire 2 contains plural aluminum particles 4 formed from aluminum (Al) and/or an alloy containing aluminum and a glass composition (oxide) 5 for fixing the aluminum particles 4 on the silicon substrate 3.

The plural aluminum particles 4 join (necking) with each other at necking joint portions 6 by sintering. The aluminum particles 4 can be formed from not only aluminum but also an alloy containing aluminum. The alloy containing aluminum contains at least one kind of element out of silver (Ag), copper (Cu), silicon (Si), magnesium (Mg), and calcium (Ca). For example, the conductivity of the alloy (Al—Ag) can be increased by adding silver. The strength of an alloy (Al—Cu) can be increased by adding copper. The abrasion resistance of an alloy (Al—Si) can be increased by adding silicon. The strength and the corrosion resistance of an alloy (Al—Mg, Al—Ca) can be increased by adding magnesium or calcium.

The aluminum particles 4 are formed from Particle Group A (4A) with a volume ratio of 95% in a range of particle diameter larger than or equal to 0.5 μm and smaller than 1.5 μm, and Particle Group B (4B) with a volume ratio of 95% in a range of particle diameter larger than or equal to 1.5 μm and smaller than 8 μm. The total weight of the plural particles 4 of Particle Group A (4A) and the total weight of the plural particles 4 of Particle Group B (4B) are approximately equal. By this arrangement, as the particles 4 of Particle Group A (4A) with smaller particle diameters enter the gaps between the aluminum particles 4 of Particle Group B (4B) with larger particle diameters so that the density of the aluminum particles 4 can be increased, it is possible to form a densified electrode wire 2.

The oxide (glass composition) 5 covers the aluminum particles 4 and bonds the aluminum particles 4 to the silicon substrate 3. The oxide (glass composition) 5 contains vanadium (V) and phosphorus (P), as shown in Examples 1 to 30 in Table 1. As the oxide 5 is a glass composition, the oxide 5 contains a glass phase 5a, and crystal phases (minute crystals) 5b are formed such as to disperse in the glass phase 5a. The particle diameters of the crystal phases (minute crystals) 5b were approximately 10 to 60 nm.

A chemical compound layer 7 containing vanadium and aluminum is formed on the surfaces of the aluminum particles 4. An oxide layer of aluminum may be provided on the aluminum 4 side of the chemical compound layer 7. The chemical compound layer 7 is formed with a uniform thickness on the surface of the aluminum particles 4. The thickness of the chemical compound layer 7 was approximately 10 to 100 nm. The surfaces of the aluminum particles 4 are covered by the chemical compound layer 7, and further covered by the oxide (glass composition) 5

The valence states of the oxide (glass composition) 5 and the chemical compound layer 7 were analyzed by an X ray photoelectron spectrometer (ESCA). Taking the contamination state of the surface of the electrode wire 2 into account, the analysis was performed after performing argon (Ar) etching for 30 seconds. A result of the analysis is shown in Table 2.

TABLE 2

| Example | Glass System | Ratio of Valence of V [%] | |
|---|---|---|---|
| | | $V^{5+}$ | $V^{4+}$ or Lower |
| 5 | V—P—Sb—Ba—O System | 24 | 76 |
| 10 | V—P—Li—Fe—O System | 16 | 84 |
| 19 | V—P—Ba—Zn—O System | 30 | 70 |
| 20 | V—P—Ba—Zn—W—O System | 40 | 60 |
| 27 | V—P—Fe—Ba—W—Cu—O System | 11 | 89 |
| 28 | V—P—Fe—Li—Ba—W—O System | 22 | 78 |
| 29 | V—P—Ba—Te—K—W—O System | 35 | 65 |
| 30 | V—P—Sb—Ba—Te—K—W—O System | 14 | 86 |

As shown in Table 2, the analysis was performed on the oxide (glass composition) 5 and the chemical compound layer 7 covering the aluminum particles 4 of the electrode wire 2 respectively in Example 5, Example 10, Example 19, Example 20, and Examples 27 to 30. In these Examples, as shown in Table 1, the transition point is 375° C. or lower, and evaluation by the tight adhesiveness test is 'S', and evaluation by the water resistance test also is 'S'. As shown in Table 2, it proved that in these Examples, atoms of vanadium with valence of 4 or less ($V^{4+}$ and lower, namely, $V^{4+}$, $V^{3+}$, $V^{2+}$, $V^{1+}$, and $V^{0}$) were contained with a quantity ratio of 60% or higher. On the other hand, it proved that in these Examples, atoms of vanadium with a valence of 5 ($V^{5+}$) were contained with a quantity ratio of 40% or lower. Evaluation by the water resistance test was all 'S' in Example 5, Example 10, Example 19, Example 20, and Examples 27 to 30, and it particularly proved that the higher the quantity ratio of vanadium atoms with valence of 4 or less ($V^{4+}$ and lower) is, the more the water resistance of the electrode wire 2 improves. That is, the water resistance of the electrode wire 2 improves more with the quantity ratio of 84% in Example 10 and 89% in Example 27, compared with the quantity ratio of 60% in Example 20.

Further, analysis of X ray diffraction (XRD) was performed on the chemical compound layer 7 respectively for Examples 1 to 30. From this analysis, it was confirmed that, in the chemical compound layer 7, there were formed $Al_3V$, $AlV_3$, $Al_{0.8}Sb_{1.0}V_{0.2}O_4$, $Al_{0.5}Sb_{1.0}V_{0.5}O_4$, $AlV_2O_4$, $AlVO_3$, $VO_2.AlO_2.PO_2$, $Al_{0.02}V_{0.98}O_2$, and $Al_{0.07}V_{1.93}O_4$. Vanadium of $Al_3V$ and $AlV_3$ can be zero valent ($V^0$). Vanadium of $Al_{0.8}Sb_{1.0}V_{0.2}O_4$ can be trivalent ($V^{+3}$). Vanadium of $Al_{0.5}Sb_{1.0}V_{0.5}O_4$ can be trivalent ($V^{+3}$) and quadrivalent ($V^{+4}$). Vanadium of $AlV_2O_4$ can be univalent ($V^{+1}$), divalent ($V^{+2}$), trivalent ($V^{+3}$), and quadrivalent ($V^{+4}$). Vanadium of $AlVO_3$ can be trivalent ($V^{+3}$). Vanadium of $VO_2.AlO_2.PO_2$ can be quadrivalent ($V^{+4}$). Vanadium of $Al_{0.02}V_{0.98}O_2$, can be quadrivalent ($V^{+4}$). Vanadium of $Al_{0.07}V_{1.93}O_4$ can be quadrivalent ($V^{+4}$).

It proved that the chemical compound layer 7 contains aluminum and vanadium. It proved that this vanadium includes vanadium with a valence of 4 or less. Further, each of the respective electrode wires 2 in Examples 1 to 30 was evaluated 'S or A' with high water resistance, and correspondingly, a chemical compound layer 7 containing aluminum and vanadium was formed on the surface of the aluminum particles 4. Vanadium of the chemical compound layer 7 included vanadium with a valence of 4 or less. Vanadium with a valence of 4 or less was also included in the oxide (glass composition) 5. From the above, as a factor for improvement in the water resistance, it is thought that vanadium with a valence of 4 or less in the oxide (glass composition) 5 and aluminum of the aluminum particles 4 reacted with each other during firing, and a chemical compound layer 7 containing aluminum and vanadium with a valence of 4 or less was formed such as to cover the surface of the aluminum particles 4 with densification, and the water resistance of the electrode wire 2 was thereby improved.

The water resistance improved because the chemical compound layer 7 was formed on the surface of the aluminum particles 4. Accordingly, the manufacturing method is not limited to the above as long as this chemical compound layer 7 can be formed. For example, instead of the aluminum particles 4, by uniformly forming a chemical compound layer 7 containing vanadium with a valence of 4 or less on the surface of aluminum in a bulk form such as an aluminum foil or aluminum film, improvement in the water resistance can be expected. Further, instead of the method for performing heat treatment (firing) of the conductive paste, the method for forming the chemical compound layer 7 containing vanadium with a valence of 4 or less may be a method that forms the film of a chemical compound layer 7 on the surface of aluminum by spattering with the above-described glass composition as a target. Still further, it is also possible to use a method, such as a plasma CVD process, for forming a film that can cover the surface of aluminum with a chemical compound layer 7.

On the other hand, the electrode wires 2 prepared in Comparative Example 4 and Comparative Example 5 shown in Table 1 were also observed by the scanning electronic microscope-energy divergence X ray analysis device (SEM-EDX). Metal, such as lead (Pb) or bismuth (Bi), deposited on the boundary surfaces between the aluminum particles 4, and segregation of the glass component (lead, bismuth) of the glass composition was observed. It is thought that this is because that lead of a Pb system glass or bismuth of a Bi system glass was reduced, by oxidation of the aluminum particles 4 by the Pb system glass or the Bi system glass, and thus deposited. It is thought that a uniform chemical compound layer 7 was consequently not formed on the surface of aluminum, and improvement in the water resistance was difficult.

Further, analysis of X ray diffraction (XRD) was performed on the electrode wires 2 prepared in Comparative Example 4 and Comparative Example 5. From this analysis, it was confirmed that aluminum hydroxide ($Al(OH)_3$) was generated from the electrode wire 2 having changed in color. It is thought that this caused the change in color of the electrode. On the other hand, it proved that aluminum hydroxide was not generated from the electrode wire 2 in each of Examples 1 to 30, and a chemical compound layer 7 was generated instead. Each of the chemical compound layer 7 was formed by a chemical compound containing vanadium with a valence of 4 or less.

Second Embodiment

[Discussion about Weight Ratios of Glass Composition (Powder of Oxide) and Aluminum Particles in Conductive Paste]

In a second embodiment, discussion was made on the weight ratios of the glass composition (powder of oxide) 5 (see FIG. 2) and the aluminum particles 4 (see FIG. 2) of a conductive paste.

As shown in Table 3, in Examples A1 to A9 in the second embodiment, conductive pastes were prepared, changing the weight ratios of the glass composition (powder of oxide) 5 and the aluminum particles 4 of the conductive pastes, further, electrode wires 2 (see FIG. 2) were prepared using these conductive pastes, and respective characteristics were evaluated. As the evaluated characteristics, a tight adhesiveness test (peel test), a water resistance test, and measurement of the specific resistance were performed on the electrode wires 2.

TABLE 3

| Example | Aluminum Amount (Weight %) | Glass Amount (Weight %) | Tight Adhesiveness Test | Water Resistance Test |
|---------|---------------------------|-------------------------|------------------------|----------------------|
| A1 | 99.95 | 0.05 | B | A |
| A2 | 99.9 | 0.1 | A | A |
| A3 | 99.5 | 0.5 | A | A |
| A4 | 99 | 1 | A | A |
| A5 | 97 | 3 | S | A |
| A6 | 95 | 5 | S | A |
| A7 | 90 | 10 | S | A |
| A8 | 85 | 15 | S | A |
| A9 | 80 | 20 | S | A |

(2-1 Preparation of Glass Composition (Powder of Oxide))

As the glass composition (powder of oxide) 5, a glass composition (powder of oxide) 5 having the composition of the same glass system as in Example 10 in Table 1 was prepared and used. Iron and lithium were added as additives to the main components of vanadium and phosphorus in the glass composition (powder of oxide) 5 in Example 10.

(2-2 Preparation of Conductive Paste)

Similarly to the first embodiment, as metal particles to be contained in the conductive pastes, two kinds of aluminum particles 4 (4A, 4B) which are a Particle Group A (4A, see FIG. 2) with an average particle diameter (D50) of 1 μm and a Particle Group B (4B, see FIG. 2) with an average particle diameter (D50) of 5 μm were prepared. The aluminum particles 4 (4A, 4B) of the Particle Group A and Particle Group B were mixed and used such that the mixture ratio of Particle Group A (4A) and Particle Group B (4B) is 1:1.

In respective Examples A1 to A9, the aluminum particles 4 (4A, 4B) and the glass composition (powder of oxide) 5 were mixed, changing the weight ratios thereof, and further to these mixtures, a binder resin and a solvent were added and mixed for kneading. The binder resin dissolved in the solvent, the aluminum particles 4 (4A, 4B) and the powder of the glass compositions (oxide) 5 dispersed in the binder resin having dissolved in the solvent, and the respective conductive pastes were thereby completed. Ethyl cellulose was used as the binder resin, and butyl carbitol acetate was used as the solvent.

Respectively for the Examples A1 to A9, each amount of aluminum in Table 3 is described by the weight ratio of the mixed aluminum particles 4 (4A, 4B) in weight % to the total of the weight of the mixed aluminum particles 4 (4A, 4B) and the weight of the glass composition (powder oxide) 5.

Respectively for the Examples A1 to A9, each amount of glass in Table 3 is described by weight ratio of the glass composition (powder of oxide) in weight % to the total of the weight of the mixed aluminum particles 4 (4A, 4B) and the weight of the glass composition (powder oxide) 5. Accordingly, the total of the amount of aluminum and the amount of glass is 100 weight % in each of Examples A1 to A9.

As shown in Table 3, in Example A1, the amount of aluminum was set to 99.95 weight %, and the amount of glass was set to 0.05 weight %.

In Example A2, the amount of aluminum was set to 99.9 weight %, and the amount of glass was set to 0.1 weight %.

In Example A3, the amount of aluminum was set to 99.5 weight %, and the amount of glass was set to 0.5 weight %.

In Example A4, the amount of aluminum was set to 99 weight %, and the amount of glass was set to 1 weight %.

In Example A5, the amount of aluminum was set to 97 weight %, and the amount of glass was set to 3 weight %.

In Example A6, the amount of aluminum was set to 95 weight %, and the amount of glass was set to 5 weight %.

In Example A7, the amount of aluminum was set to 90 weight %, and the amount of glass was set to 10 weight %.

In Example A8, the amount of aluminum was set to 85 weight %, and the amount of glass was set to 15 weight %.

In Example A9, the amount of aluminum was set to 80 weight %, and the amount of glass was set to 20 weight %.

(2-3 Forming Electrode Wire)

Similarly to the first embodiment, the conductive pastes in Examples A1 to A9 were coated on respective multi-crystal silicon substrates 3 (see FIG. 2) used for an electronic component 1 (see FIG. 2) such as a solar battery cell by a screen print method. After coating, the conductive pastes were dried by heating in the atmosphere at a temperature of 150° C. for several minutes. Thereafter, each of the conductive pastes was subjected to heat treatment by an electric furnace in the atmosphere at a firing temperature of 850° C. for 2 seconds, and thus each electrode wire 2 (see FIG. 2) was fired and completed. All of the film thicknesses of the fired electrode wires 2 were approximately 40 μm.

(2-4 Specific Resistance Measurement)

The specific resistance of the completed electrode wire 2 in each of Examples A1 to A9 was measured by the four probe method. In the specific resistance measurement, the electric resistance and the film thickness of an electrode wire 2 were measured, and the specific resistance was computed, based on the electric resistance and the film thickness.

Figure 3:
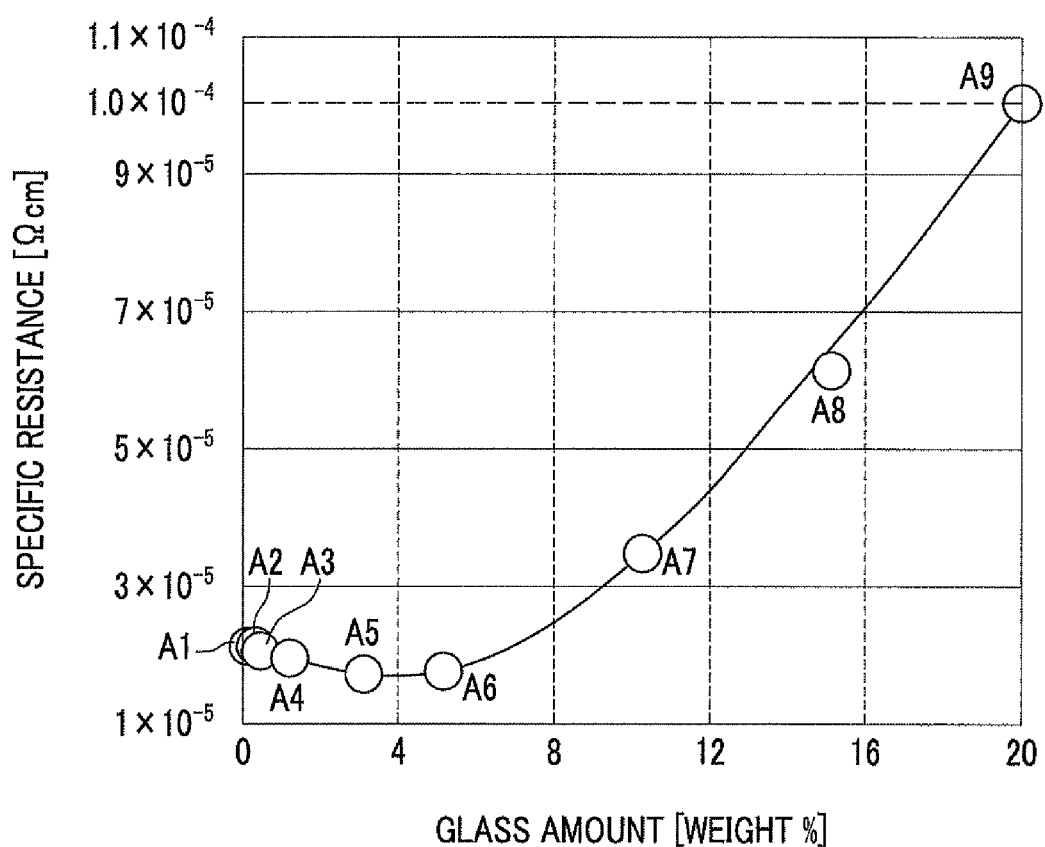
FIG. 3 is a graph representing the relationship between the specific resistance of the electrode wire and a glass amount (the weight percent of a glass composition (powder of oxide) to aluminum particles)

On the graph of the specific resistance with respect to the amount of glass in FIG. 3, plotted are points, for respective Examples A1 to A9, each of which corresponds to the specific resistance of the electrode wire 2 and the amount of glass (the weight percent of glass composition with respect to aluminum particles). As shown in FIG. 3, the specific resistances were approximately $2 \times 10^{-5}$ Ωcm and substantially constant in Examples A1 to A6. In other words, the specific resistance was approximately $2 \times 10^{-5}$ Ωcm and substantially constant with the amount of glass in a range of 0.05 weight % to 5 weight %.

In Examples A6 to A9, as the amount of glass increased, the specific resistance became larger. That is, with glass in a range from 5 weight % to 20 weight %, the larger the amount of glass was, the larger specific resistance was. It is estimated that, when the amount of glass further increases exceeding 20 weight %, the specific resistance also becomes further larger. While the specific resistance of the electrode wire 2 of an electronic component 1, such as a solar battery cell, is required to be $1.0 \times 10^{-4}$ Ωcm or lower, as the specific resistance was $1.0 \times 10^{-4}$ Ωcm in Example A9 (the amount of glass of 20 weight %), it proved that the amount of glass should be set to 0.05 weight % to 20 weight % in order to produce an electrode wire 2 with a specific resistance of $1.0 \times 10^{-4}$ Ωcm or lower.

(2-5 Tight Adhesiveness Test (Peel Test))

The strength of adhesion (tight adhesiveness) of the completed electrode wire 2 to the substrate 3 was evaluated by a peel test respectively in Examples A1 to A9. The peel test was performed by a method and with evaluation criteria which are similar to those in the first embodiment. As shown in Table 3, as a result of the peel test, Examples A5 to A9 were evaluated 'S (no peeling)', Examples A2 to A4 were evaluated 'A (slight peeling)' and Example A1 was evaluated 'B (peeling)'.

In Table 3, in comparison between the amounts of glass and the result of the tight adhesiveness test (peel test), the evaluation was 'B' in case that the amount of glass was 0.05 weight % or lower, the evaluation was 'A' in case that the amount of glass exceeded 0.05 weight %, more securely, higher than or equal to 0.1 weight % and lower than or equal to 1 weight %, and the evaluation was 'S' in case that the amount of glass exceeded 1 weight %, more securely, 3 weight % or higher. The amount of glass increases, the weight ratio of the glass composition 5 to the aluminum particles 4 (4A, 4B) to be an adhesive agent for bonding the electrode wire 2 to the silicon substrate 3 increases, and accordingly, the tight adhesiveness of the aluminum particles 4 (4A, 4B) is thought to thus improve to improve the tight adhesiveness of the electrode wire 2 as a result.

(2-6 Water Resistance Test)

As a water resistance, an acceleration test of the respective electrode wires in Examples A1 to A9 was performed such that, similarly to the first embodiment, the electrode wires were left in an environment with conditions of a temperature of 85° C. and a moisture of 85% for 1000 hours. Evaluation criteria were set similarly to those in the first embodiment. As shown in Table 3, as a result of the water resistance test, Examples A1 to A9 were evaluated 'A (slight change in color)'.

In Table 3, in comparison between the tight adhesiveness test and the water resistance test, examples in which evaluations by both the tests were 'A' or higher were Examples A2 to A9 where the amount of glass was 0.1 weight % or larger, and it proved that the amount of glass is desirably 0.1 weight % or larger.

In Example 1 where the amount of glass was 0.05 weight %, although evaluation by the tight adhesiveness test was 'B', evaluation by the water resistance test was 'A'. It is thought that this is because an amount of glass of 0.05 weight % is not enough as the amount of an adhesive agent of aluminum particles 4 (4A, 4B) but enough to form a thin chemical compound layer 7 (see FIG. 2), described in the first embodiment, on the surface of the aluminum particles 4 (4A, 4B). The aluminum particles 4 (4A, 4B) were prepared by mixing Particle Group A (4A) with an average particle diameter (D50) of 1 μm and Particle Group B (4B) with an average particle (D50) of 5 μm, wherein in case setting a large weight ratio of Particle Group B (4B) with larger particle diameters to the Particle Group A (4A), gaps between aluminum particles 4 become larger, the density of aluminum particles 4 drops, and the surface area of the aluminum particles 4 decreases. Accordingly, it is thought that the amount of glass for obtaining evaluation 'A' by the water resistance test can be further decreased from 0.05 weight % in Example A1.

Third Embodiment

[Discussion about Aluminum Alloy of Aluminum Particles in Conductive Paste]

In a third embodiment, discussion was made on aluminum alloys to be materials for the aluminum particles 4 of conductive pastes. In the third embodiment, aluminum particles 4 were prepared with various aluminum alloys, and further conductive pastes were prepared. Using the respective conductive pastes, electrode wires 2 were prepared and a water resistance test was performed.

(3-1 Preparation of Aluminum (Alloy) Particles of Aluminum Alloy)

First, the weight of aluminum metal (pure aluminum) and the weight additive metal were measured to form desired compositions. Measured aluminum and additive metal were uniformly fused and were nozzle-jetted, by a method such as water-atomizing, and aluminum (alloy) particles 4 were thus formed. The aluminum (alloy) particles 4 were dried, and by screening these aluminum (alloy) particles 4, aluminum (alloy) particles 4 classified to be in an average particle diameter (D50) range from 1.5 μm to 5 μm were obtained.

As an aluminum alloy, in Example B1, aluminum particles (alloy) 4 of an aluminum alloy (Al-92 weight % Cu) containing copper by 92 weight % were prepared.

In Example B2, aluminum particles (alloy) 4 of an aluminum alloy (Al-90 weight % Cu) containing copper by 90 weight % were prepared.

In Example B3, aluminum particles (alloy) 4 of an aluminum alloy (Al-66 weight % Cu) containing copper by 66 weight % were prepared.

In Example B4, aluminum particles (alloy) 4 of an aluminum alloy (Al-32.5 weight % Cu) containing copper by 32.5 weight % were prepared.

In Example B5, aluminum particles (alloy) 4 of an aluminum alloy (Al-10 weight % Cu) containing copper by 10 weight % were prepared.

In Example B6, aluminum particles (alloy) 4 of an aluminum alloy (Al-3 weight % Cu) containing copper by 3 weight % were prepared.

In Example B7, aluminum particles (alloy) 4 of an aluminum alloy (Al-3 weight % Mg) containing magnesium by 3 weight % were prepared.

In Example B8, aluminum particles (alloy) 4 of an aluminum alloy (Al-3 weight % Ca) containing calcium by 3 weight % were prepared.

In Example B9, aluminum particles (alloy) 4 of an aluminum alloy (Al-7 weight % Si) containing silicon by 7 weight % were prepared.

In Example B 10, aluminum particles (alloy) 4 of an aluminum alloy (Al-10 weight % Ag) containing silver by 10 weight % were prepared.

(3-2 Preparation of Glass Composition (Powder of Oxide))

As the glass composition (powder of oxide) 5, a glass composition (powder of oxide) 5 having the composition of the same glass system as in Example 10 in Table 1 was prepared and used. Iron and lithium were added as additives to the main components of vanadium and phosphorus in the glass composition (powder of oxide) 5 in Example 10.

(3-3 Preparation of Conductive Paste)

Similarly to the Example A5 in Table 3, in respective Examples B1 to B10, powder of the glass composition (oxide) 5 in 3 weight parts was mixed to 97 weight parts of the aluminum (alloy) particles 4, and further to these mixtures, a binder resin and a solvent were added and mixed for kneading. The binder resin dissolved in the solvent, the aluminum particles 4 (alloy) and the powder of the glass compositions (oxide) 5 dispersed in the binder resin having dissolved in the solvent, and the respective conductive pastes were thereby completed. Ethyl cellulose was used as the binder resin, and butyl carbitol acetate was used as the solvent.

(3-4 Forming Electrode Wire)

Similarly to the first embodiment, the conductive pastes in Examples B1 to B10 were coated on respective multi-crystal silicon substrates 3 used for an electronic component 1 such as a solar battery cell by a screen print method. After coating, the conductive pastes were dried by heating in the atmosphere at a temperature of 150° C. for several minutes. Thereafter, each of the conductive pastes was subjected to heat treatment by an electric furnace in the atmosphere at a firing temperature of 850° C. for 2 seconds, and thus each electrode wire 2 was fired and completed. All of the film thicknesses of the fired electrode wires 2 were approximately 40 μm.

(3-5 Water Resistance Test)

As a water resistance test, an acceleration of the respective electrode wires 2 in Examples B1 to B10 was performed such that, similarly to the first embodiment, the electrode wires 2 were left in an environment with conditions of a temperature of 85° C. and a moisture of 85% for 1000 hours. Evaluation criteria also were set similarly to those in the first embodiment. As a result of the water resistance test, all of Examples B1 to B10 were evaluated 'A (slight change in color)'. From this, it is thought that, also in case of using aluminum alloy as aluminum particles 4, a chemical compound layer 7 described in the first embodiment was formed and the water resistance thereby improved. For improvement in the water resistance, it proved that the aluminum particles 4 are not limited to pure aluminum, and any kind of so-called aluminum alloy particles 4 containing aluminum can improve the water resistance.

Fourth Embodiment

[Discussion about Application of Electrode Wire with High Water Resistance to Solar Battery Cell]

Figure 4A:
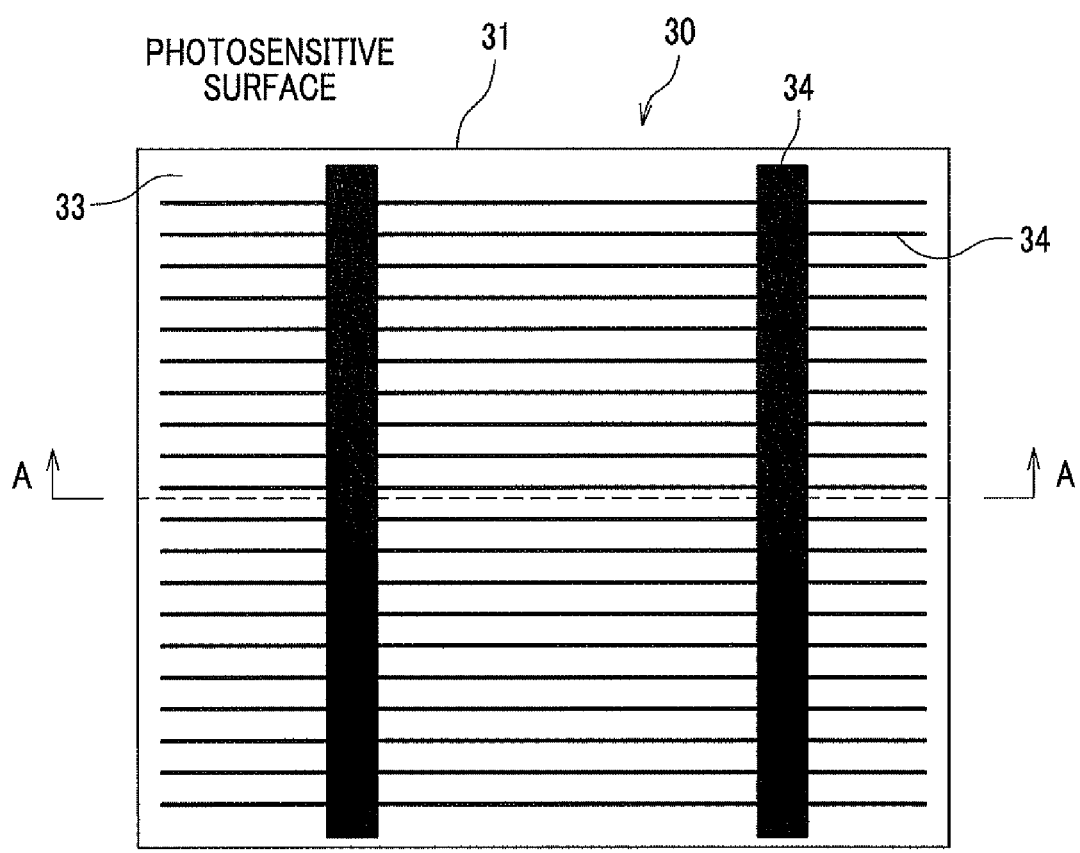
FIG. 4A is a plan view of a solar battery cell (electronic component) according to a fourth embodiment of the invention.
Figure 4B:
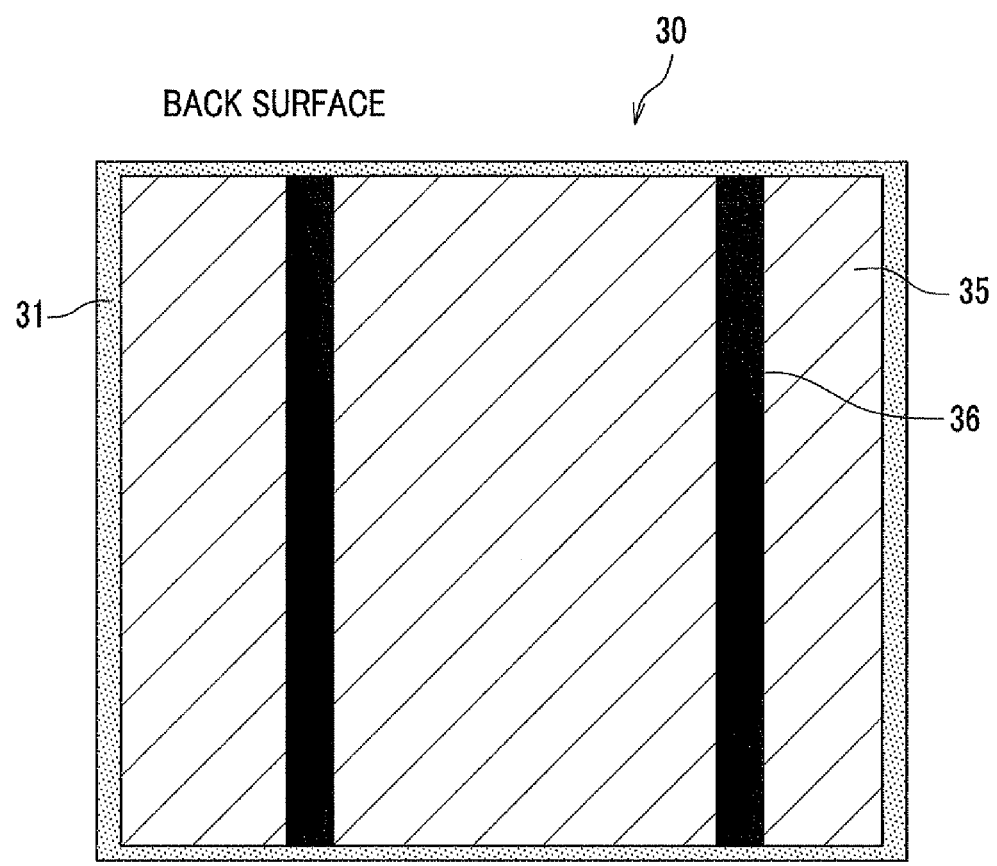
FIG. 4B is a bottom view of the solar battery cell (electronic component) according to the fourth embodiment of the invention.

FIG. 4A is a plan view of a solar battery cell (electronic component) 30(1) according to a fourth embodiment of the invention; FIG. 4B is a bottom view of the solar battery cell

Figure 4C:
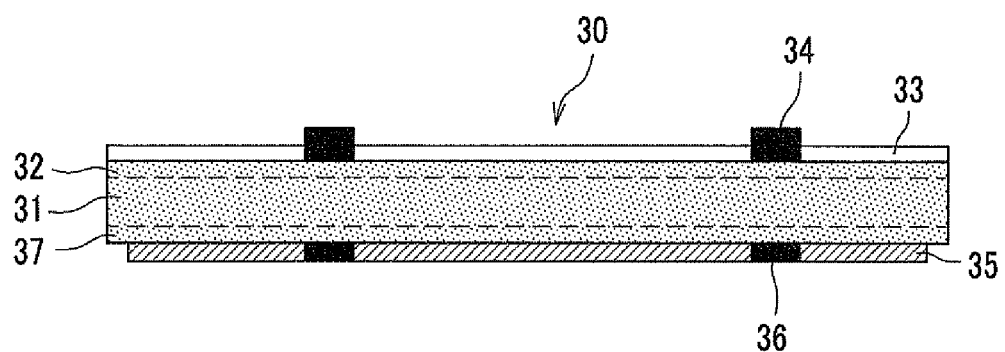
FIG. 4C is a cross-sectional view taken along direction A-A' in FIG. 4A.

30(1); and FIG. 4C is a cross-sectional view taken along direction A-A' in FIG. 4A. In the fourth embodiment, for an electronic component 1 to which the present invention is applicable, description will be made taking an example of a solar battery cell 30.

The electrode wire 2 of an electronic component 1 according to the present invention is applied to the back surface electrode 35(2) of the solar battery cell 30(1) shown in FIG. 4B and FIG. 4C. The back surface electrode 35(2) is formed on the back surface of a semiconductor substrate 31(3) formed with a p-type silicon substrate. The semiconductor 31(3) corresponds to the substrate 3 in the first embodiment, and the back surface electrode 35(2) corresponds to the electrode wire 2 in the first embodiment.

For the semiconductor 31(3), a single-crystal silicon substrate, a polycrystalline silicon substrate, or the like is used. The semiconductor substrate 31(3) contains boron (B) and the like, and is a p-type semiconductor. On the photosensitive surface side of the semiconductor 31(3), shown in FIG. 4A, a concavo-convex portion (not shown) is formed by etching or the like to reduce reflection of sunlight. Further, as shown in FIG. 4C, on the photosensitive surface side of the semiconductor substrate 31(3), phosphorus (P) or the like is doped, and a diffusion layer 32 of an n-type semiconductor is thus formed with a thickness of the submicron level. The n-type semiconductor of the diffusion layer 32 and the p-type semiconductor of the semiconductor substrate 31(3) form a p-n junction portion. In this p-n junction portion, each pair of electron and hole generated by absorption of sunlight is separated into an electron and a hole so that a voltage is generated. On the back surface side of the photosensitive surface of the semiconductor substrate 31(3), aluminum is doped in a high concentration, and an alloy layer (Back Surface Field: BSF layer) 37 of a p+-type semiconductor is formed with a thickness of submicron level. The formation of the alloy layer 37 prevents carriers generated inside the semiconductor substrate 31(3) from recombining, and the performance of the solar battery cell can thereby be improved.

As show in FIG. 4A, photosensitive-surface electrode wires 34 are provided on the photosensitive surface of the semiconductor substrate 31(3). The photosensitive-surface electrode wires 34 include thick wires disposed such as to be parallel vertically across the photosensitive surface of the semiconductor substrate 31(1), and thin wires disposed in a grid form (a pectinate shape or a ladder shape) with respect to these thick wires so that the photosensitive-surface electrode wires 34 can collect electricity from the whole photosensitive surface. On the photosensitive surface of the semiconductor substrate 31(3), a reflection preventing layer 33 of a silicon nitride ($Si_3N_4$) or the like is formed with a thickness of approximately 100 nm. The photosensitive-surface electrode wires 34 are formed by firing a conductive paste containing glass powder and silver particles.

As shown in FIG. 4B and FIG. 4C, on the back surface of the photosensitive surface of the semiconductor substrate 31(3), a back surface electrode 35(2) and output electrodes 36 are provided. The back surface electrode 35(2) is arranged such as to cover almost the whole surface of the back surface of the photosensitive surface of the semiconductor substrate 31(3), and electricity can be collected from almost the whole back surface of the photosensitive surface of the semiconductor substrate 1. The output electrodes 6 are disposed in parallel such as to be vertically across the back surface of the photosensitive surface of the semiconductor substrate 31(3), and electricity can be collected from the back surface electrode 5. The output electrodes 36 are formed by firing a conductive paste containing powder of oxide and silver particles. The back surface electrode 35(2) is formed by firing a conductive paste containing powder of oxide and aluminum particles, as will be described later.

A method for manufacturing the solar battery cell 30(1) will be described below.

(Preparation of Conductive Paste)

In the fourth embodiment, as the conductive paste for the back surface electrode 35(2), the same conductive paste as used in Example A5 in Table 3 was prepared and used.

(Preparation of Solar Battery Cell)

A p-type silicon substrate was prepared as the semiconductor substrate 31(3). Then, though not shown, for improvement in the light incidence efficiency, the photosensitive surface side of the semiconductor substrate 31(3) was etched to form a texture, using a mixed liquid of 1% sodium hydroxide (NaOH) and 10% isopropyl alcohol ($CH_3CH(OH)CH_3$).

A liquid containing phosphorus pentoxide ($P_2O_5$) was coated on the photosensitive surface side of the semiconductor substrate 31(3) and treated for 30 minutes at 900° C., to thereby diffuse phosphorus (P) from phosphorus pentoxide to the semiconductor substrate 31(3) and thus form the diffusion layer 32 of a n-type semiconductor on the photosensitive surface side. After removing phosphorus pentoxide, the reflection preventing layer 33 of silicon nitride film was formed uniformly thick on the diffusion layer 32. This silicon nitride film can be formed by a plasma CVD method or the like with a mixed gas of silane ($SiH_4$) and ammonia ($NH_3$) as a raw material.

Then, in order to form the photosensitive surface electrode wires 34, the reflection preventing layer 33 on the photosensitive surface was removed in a grid form where the photosensitive surface electrode wires 34 are to be disposed. A commercially available conductive paste (silver paste) containing powder of oxide and silver particles was coated in a grid form by a screen print method on photosensitive surface side, and was dried by heating at 150° C. for 30 minutes.

On the back surface side of the photosensitive surface of the semiconductor substrate 31(3), a commercially available conductive paste (silver paste) containing powder of oxide and silver particles was coated for the output electrodes 36 by the screen print method such as to form the pattern shown in FIG. 4B. For the back surface electrode 35(2), a conductive paste (aluminum paste) containing powder of oxide and aluminum particles, the conductive paste being the same as used in Example A5 in Table 3, was coated by the screen print method such as to form the pattern shown in FIG. 4B. Then, the output electrodes 36 and the back surface electrode 35(2) were dried by heating at 150° C. for 30 minutes. For coating the conductive paste, whichever of the photosensitive surface side and the back surface side may be coated and dried first.

Then, using a tunnel furnace, each conductive paste (silver paste or aluminum paste) was heated in the atmosphere up to 850° C., the corresponding whole semiconductor substrate 31(3) with the conductive paste being heated, and was subjected to firing for 2 seconds, with this heated state maintained. Thus, the photosensitive surface electrode wires 34, the output electrodes 36, and the back surface electrode 35(2) were formed, thereby completing a solar battery cell 30(1). Further, through this firing, on the back surface side of the semiconductor substrate 31(3), aluminum diffuses with a high concentration from the aluminum particles 4 (see FIG. 2) of the back surface electrode 35(2) into the semiconductor substrate 31(3) under the back surface electrode 35(2), and an alloy layer 37 of the p+ type semiconductor is thereby formed. Still further, through this firing, on the photosensitive surface side of the semiconductor substrate 31(3), the oxide (glass composition) contained in the photosensitive surface electrode wires 34 and the reflection preventing layer 33 react with each other, and the photosensitive surface electrode wires 34 and the diffusion layer 32 are ohmic-connected.

Further, for comparison, a solar battery cell 30(1) was prepared that is different only in that the same conductive paste as used in Comparative Example 4 in Table 1 was used to form the back surface electrode 35(2).

(Evaluation of Solar Battery Cell)

On the above-described solar battery cell according the present invention and the above-described battery cell for comparison, a tight adhesiveness test (peel test) and a water resistance test of each back surface electrode 35(2) were performed, and the efficiency of each solar battery cell was measured. The tight adhesiveness test (peel test) and the water resistance test were performed with a method and criteria which are similar to those in the first embodiment. Evaluation by the tight adhesiveness test (pee; test) was Satisfactory to be 'S', on both the solar battery cells. Evaluation by the water resistance test was 'A' for the solar battery cell according to the present invention and 'B' for the solar battery cell for comparison. As a conductive paste containing a lead system glass composition with a low melting point was used for the back surface electrode 35(2) of the solar battery cell for comparison, the lead component in the glass composition was reduced by aluminum particles in firing to deposit as metal particles of lead between the aluminum particles or the like, and the transition point of the glass composition became high, resulting in that it became difficult to cover the surface of the aluminum particles by the glass composition and the water resistance of the back surface electrode 35(2) dropped. For a back surface electrode 35(2) of the solar battery cell according to the invention, as the surface of aluminum particles is covered by a chemical compound layer 7, the water resistance of the back surface electrode 35(2) can be improved.

Further, it proved that the solar battery cell 30(1) according to the invention has a higher conversion efficiency than that of the solar battery cell for comparison. It is thought that this is because the electric resistance value of the back surface electrode 35(2) could be decreased and because the alloy layer 37 of a p+ type semiconductor formed by diffusion of aluminum from the aluminum particles 4 (see FIG. 2) of the back surface electrode 35(2) was formed with an appropriate concentration of impurities (aluminum). Thus, it proved that the chemical compound layer 7 not only increases the water resistance of the aluminum particles, but also does not inhibit electrical conduction between the aluminum particles or supply of aluminum from the aluminum particles to the alloy layer 37. From the above, it was confirmed that an electrode wire 2 (see FIG. 2) for an electronic component 1 according to the invention can be applied as the p-type electrode 37(2) of a solar battery cell 30(1). Further, it was also confirmed that an electrode wire 2 (see FIG. 2) for an electronic component 1 according to the invention can also be applied to the above-described back surface electrode 35(2) of the solar battery cell 30(1). The back surface electrode 35(2) is an electrode wire 2 to be ohmic-connected to a p-type semiconductor and is thought to be also applied as an electrode wire 2 that is ohmic-connected with the p-type semiconductor of an electronic component 1 other than a solar battery cell 30(1). Of course, a back surface electrode 35(2) has a low specific resistance and a high water resistance and accordingly can also be used merely as an electrode wire 2 for connecting electrodes.

Fifth Embodiment

[Discussion about Application of Electrode Wire with High Water Resistance to Plasma Display Panel]

Figure 5:
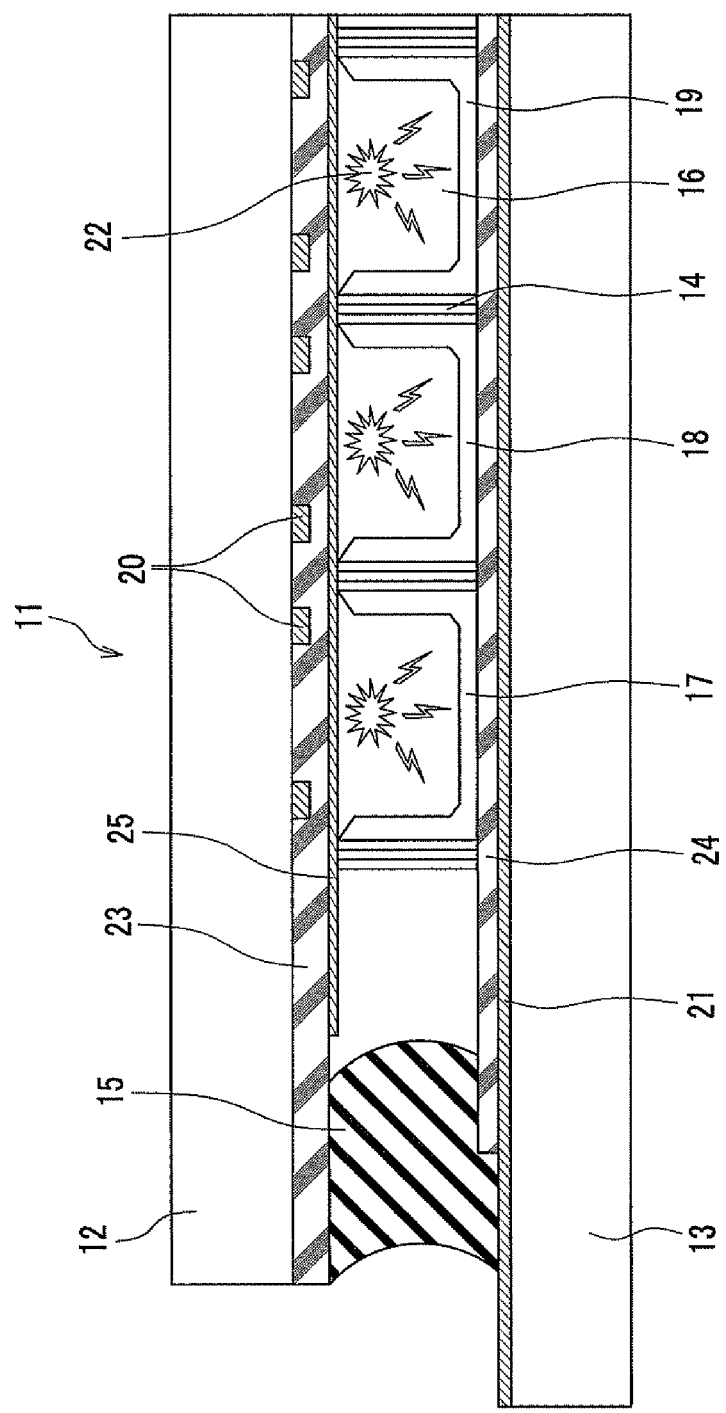
FIG. 5 is a part of a cross-sectional view of a plasma display panel (electronic component) according to a fifth embodiment of the invention.

FIG. 5 is a part of a cross-sectional view of a plasma display panel (PDP: electronic component) 11(1) according to a fifth embodiment of the invention. In the fifth embodiment, an electronic component 1 to which the invention can be applied will be described below, taking an example of a plasma display panel 11. In the fifth embodiment, electrode wires 2 for an electronic component 1 according to the invention are applied to the display electrode 20 and the address electrode 21 of a plasma display panel 11(1). The plasma display panel 11(1) is arranged such that a front plate 12(3) and a back plate 13(3) face each other with a gap of 100 to 150 μm, and the gap 14 between the front plate 12(3) and the back plate 13(3) is maintained by isolation walls 14. The marginal portions of the front plate 12(3) and the back plate 13(3) are tightly sealed by an adhesive sealing material 15, and rare gas is filled inside the panel at the gap between the front plate 12(3) and the back plate 13(3).

Display electrodes 20(2) are formed on the front plate 12(3). The front plate 12(3) corresponds to a silicon substrate 3 in the first embodiment, and the display electrodes 20(2) correspond to electrode wires 2 in the first embodiment. A dielectric layer 23 is formed on the display electrodes 20(2), and a protection layer 25 (for example, a vapor deposited film of magnesium oxide (MgO)) for protecting the display electrodes 20(2) and the like from discharge is formed on the dielectric layer 23.

An address electrode 21(2) is formed on the back plate 13(3). The back plate 13(3) corresponds to a silicon substrate 3 in the first embodiment, and the address electrode 21(2) corresponds to an electrode wire 2 in the first embodiment. In a plan view, the address electrode 21(2) is formed such as to be perpendicular to the display electrodes 20(2). A dielectric layer 24 is formed on the address electrode 21(2), and isolation walls 14 are provided to form cells 16 on the dielectric layer 24. The isolation walls 14 have a structure in a stripe form or a grid (or box) form.

In the gap between the front plate 12(3) and the back plate 13(3), minute spaces partitioned by isolation walls 14 become cells 16. A fluorescence body 17, 18, or 19 is filled in a cell 16. Three cells corresponding to three primary colors, namely a cell 16 in which red fluorescence body 17 is filled, a cell 16 in which green fluorescence body 18 is filled, and a cell 16 in which blue fluorescence body 19 is filled form one pixel. The respective pixels can emit lights in various colors, according to signals applied to display electrodes 20(2) and the address electrode 21(2).

A method for manufacturing a plasma display panel 11(1) will be described below.

(Preparation of Conductive Paste)

First, aluminum was melt, and aluminum particles in a spherical shape were prepared by a water atomizing method. These aluminum particles were treated with a ball mill in an organic solvent, and aluminum particles in a flake shape (plate shape) were formed. Further, in order to improve the thermal stability of these flake shaped aluminum particles, annealing treatment was performed in a reduction atmosphere at a temperature of 700° C. Particles with a particle diameter of 8 μm or larger were removed by screening, and particles with a diameter smaller than 1.5 μm were also removed by screening. Remaining particles, which were aluminum particles after removing large particles and small particles by screening, had a volume ratio of approximately 95% or larger in a range of a particle diameter from 1.5 μm or larger and smaller than 8 μm, and the average particle diameter (D50) was 5 μm.

As the glass composition (powder of oxide) 5, a glass composition (powder of oxide) 5 having the composition of the same glass system as that in Example 10 in Table 1 was prepared and used. In the glass composition (powder of oxide) 5 in Example 10, iron and lithium were added as additives to the main components of vanadium and phosphorus.

The powder of the glass composition (oxide) 5 in 0.1 weight part were mixed to 100 weight parts of the prepared aluminum (alloy) particles 4 in a flake shape. Further, to this mixture, a binder resin and a solvent were added and mixed, and then the mixture was kneaded. The binder resin dissolved in the solvent, then the aluminum particles 4 and the powder of the glass composition (oxide) 5 dispersed in the binder resin having dissolved in the solvent, and a conductive paste was thus completed. Herein, ethyl cellulose was used as the binder resin, and α-terpineol was used as the solvent.

(Preparation of Plasma Display Panel)

Then, the plasma display was produced. First, the conductive paste was coated on the whole surfaces of the front plate 12(3) and the back plate 13(3) by the screen print method, and was dried in the atmosphere at 150° C. Unnecessary portions of the coated film of the conductive paste were removed by a photolithography method and an etching method, and patterning of the display electrodes 20(2) and the address electrode 21(2) was performed. Thereafter, firing was performed in the atmosphere for 30 minutes at a firing temperature of 600° C., and the display electrodes 20(2) and the address electrode 21(2) were completed. In this firing, although the firing atmosphere became acid atmosphere, a change in the color of the aluminum metal particles, caused by chemical reaction, or the like did not particularly occur on the display electrodes 20(2) and the address electrode 21(2) through this firing.

Then, a dielectric paste to become the dielectric layers 23 and 24 were coated on each of the front plate 12(3) and the back plate 13(3), and were fired for 30 minutes in the atmosphere at a firing temperature of 610° C. In this firing, the firing atmosphere became acid atmosphere, the dielectric layer 23 directly contacted the display electrodes 20(2), and the dielectric layer 24 directly contacted the address electrode 21(2), however, chemical reaction between the dielectric layer 23 and the display electrodes 20(2) was not caused by this firing, and chemical reaction between the dielectric layer 24 and the address electrode 21(2) was not caused by this firing. The protection layer 25 was vapor-deposited from the dielectric layer 23 side of the front plate 12(3).

Isolation walls 14 were produced by forming a material containing at least a glass composition in a powder form and a filler into a stripe shape or a grid pattern and sintering the formed structure in a temperature range from 500 to 600° C. These isolation walls 14 were disposed on the dielectric layer 24 to form the cells 16. Then, pastes for fluorescence bodies corresponding to the three primary colors were filled into the corresponding cells 16 and were fired in a temperature range from 450 to 500° C. Thus, the red fluorescence bodies 17, the green fluorescence bodies 18, the blue fluorescence bodies 19 were formed in the cells 16.

Then, the adhesive sealing material 15 was coated on the marginal portion of either the front plate 12(3) or the back plate 13(3) by a dispenser method or a printing method.

Then, the front plate 12(3) and the back plate 13(3) were subjected to sealing-adhesion. For the sealing-adhesion of the front plate 12(3) and the back plate 13(3), the front plate 12(3) and the back plate 13(3) were disposed facing each other by accurate position alignment, and were heated to a range from 420 to 500° C. In this heating, the gas in the cells 16 was removed and a noble gas was filled instead. The adhesive sealing material 15 may be preliminarily fired simultaneously with the firing of the pastes for fluorescence bodies in forming the fluorescence bodies 17 to 19. By preliminarily firing the adhesive sealing material 15, gas bubbles included in the adhesive sealing material 15 can be reduced. In FIG. 2, the adhesive sealing material 15 and the address electrode 21(2) directly contact with each other. The display electrodes 20(2) also directly contact with the adhesive sealing material 15 so that the electrode is drawn outside. The adhesive sealing material 15 was heated in the preliminary firing and in the glass seal-adhering, and the firing atmosphere became acid atmosphere in this heating, however, chemical reaction of the adhesive sealing material 15 with the display electrodes 20(2) and the address electrode 21(2) was not caused by this heating. In such a manner the plasma display panel 11(1) was completed.

(Evaluation of Plasma Display Panel)
(Appearance Test)

An appearance test of the periphery of the display electrodes 20(2) and the address electrode 21 was performed. Generation of a gap or a change in color was not recognized at the surface boundary portion between the address electrodes 20(2) and the front plate 12(3) or the surface boundary portion between the display electrodes 20(2) and the dielectric layer 23. Further, generation of a gap or a change in color was not recognized at the surface boundary portion between the address electrode 21(2) and the back plate 13(3) or the surface boundary portion between the address electrode 21(2) and the dielectric layer 24. Thus, the plasma display panel 11(1) was produced in a satisfactory appearance state.

(Lighting Test)

Subsequently, a lighting test of the produced plasma display panel 11(1) was performed. In order to make cells 16 of the plasma display panel 11(1) light (emit light), a voltage was applied between the display electrodes 20(2) of the cells 16 desired to light and the address electrode 21(2) to perform address discharge in the cells 16, and noble gas was thereby excited into a plasma state so that wall charges were accumulated inside the cells 16. Then, by applying a certain voltage between a pair of display electrodes 20(2), display discharge occurred only in the cells 16 in which the wall charges have been accumulated, and the cells 16 were thus made to emit ultraviolet rays 22. Using these ultraviolet rays 22, the fluorescence bodies 17 to 19 were made to emit light to display an image (information).

Before and after the display of this image information, the specific resistances of the display electrodes 20(2) and the address electrode 21(2) did not increase. Further, without a drop in the voltage resistance between adjacent display electrodes 20(2) and the voltage resistance between adjacent address electrodes 21, voltage could be increased to light cells 16. Further, migration phenomenon of an electrode wire of a silver thick film or the like, which particularly cause a problem, was not recognized. For the display electrodes 20(2) and the address electrode 21(2) of the plasma display panel 11(1) in the fifth embodiment, expensive silver was not used, which can significantly contribute to reducing the cost.

Sixth Embodiment

Figure 6:
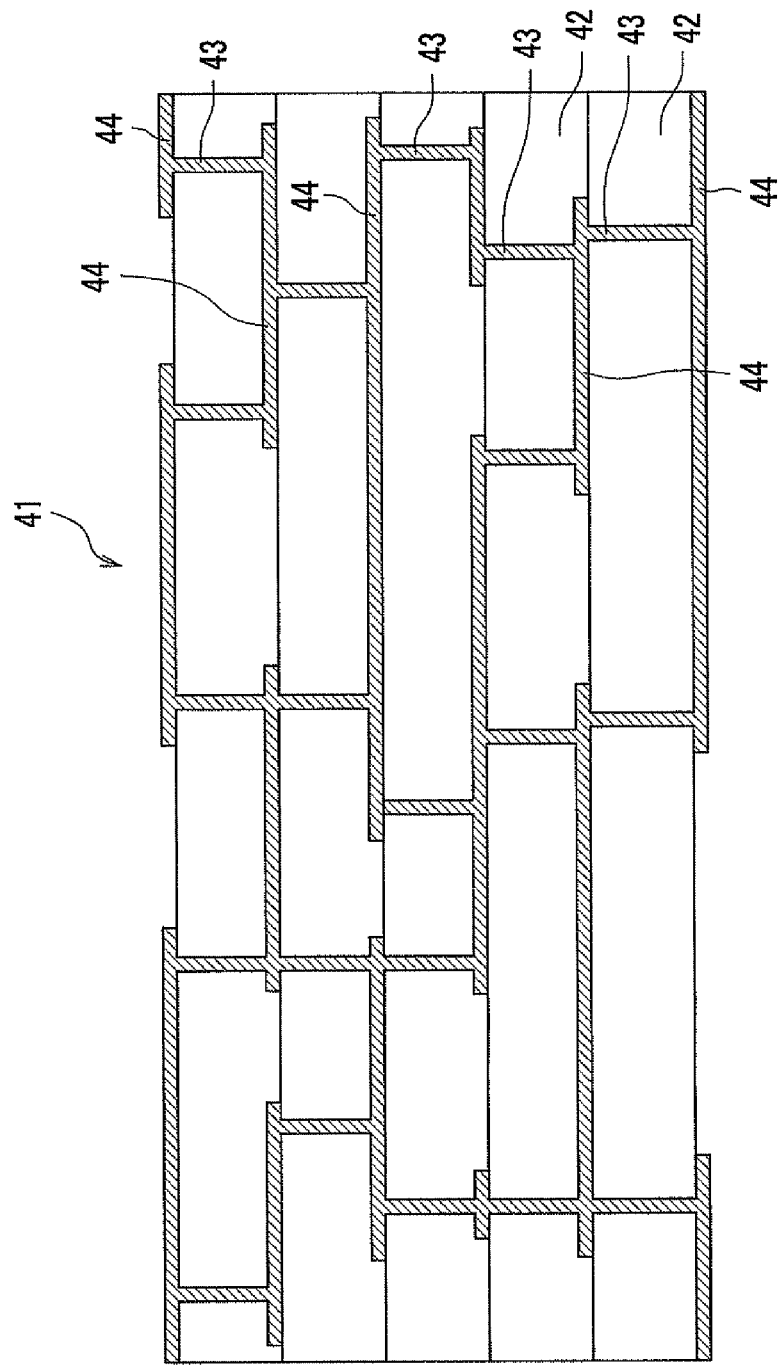
FIG. 6 is a cross-sectional view of a ceramic multi-layer wire substrate (electronic component) according to a sixth embodiment of the invention.

FIG. 6 is a cross-sectional view of a ceramic multi-layer wire substrate (electronic component) 41(1) according to a sixth embodiment of the invention. In the sixth embodiment, an example of applying an electronic component 1 (see FIG. 2) according to the invention to a multi-layer wire substrate will be described. FIG. 6 shows a multi-layer wire substrate 41(1) formed with five layers of low temperature co-fired ceramics (LTCC), as an example of a multi-layer wire substrate. Electrode wires 2 for an electronic component 1 according to the invention are used for the through hole electrodes 43(2) and the wires 44(2) of the multi-layer wire substrate 41(1). The wires 44(2) are formed on the upper surfaces and the lower surfaces of respective ceramic substrates 42(3). In FIG. 6, the wires 44(2) are formed in six layers. The wires 44(2) of the respective layers are connected by the through hole electrodes 43(2). The through hole electrodes 43(2) penetrate through the ceramic substrate 42(3). In the multi-layer wire substrate 41(1), the wires 44(2) and the through hole electrodes 43(2) are three dimensionally formed. The ceramic substrate 42(3) corresponds to the substrate 3 in the first embodiment, and the through hole electrodes 43(2) and the wires 44(2) correspond to electrode wires 2 in the first embodiment.

A method for manufacturing the multi-layer wire substrate 41(1) will be described below.

(Preparation of Conductive Paste)

In the sixth embodiment, as the conductive paste for the through hole electrodes 43(2) and the wires 44(2), the same conductive paste as used in Example A5 in Table 3 was prepared and used.

(Producing Multi-layer Wire Substrate)

First, a plurality of green sheets formed by kneading glass powder, ceramics powder and a binder were prepared. The green sheets became ceramic substrates 42(3) on respective layers by firing described later. Then, penetrating holes were formed at desired positions of the green sheets. To the green sheets with penetrating holes, the conductive paste same as used in Example A5 was coated by a printing method in a desired pattern. Herein, the conductive paste was also filled in the penetrating holes. The conductive paste coated in a wiring patter became the through hole electrodes 43(2) and the wires 44(2) by firing described later. As necessary, for example, a wiring pattern is formed by coating the conductive paste by the printing method also on the back surface of the green sheet on the lowermost layer shown in FIG. 6. In case of coating the conductive paste on the back surface of a green sheet, the coating is to be performed after drying the conductive paste coated on the surface of the uppermost sheet.

Figure 7:
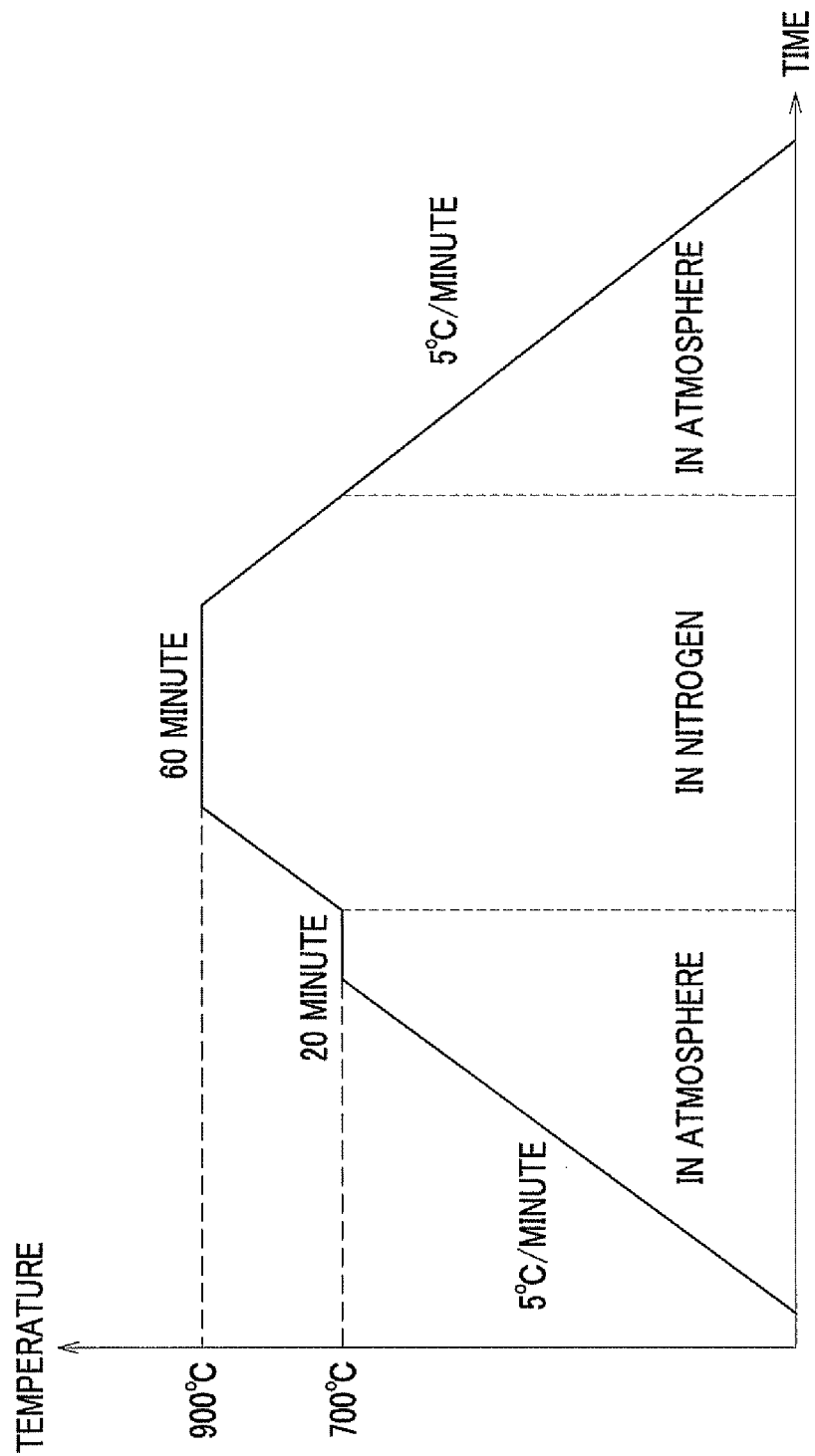
FIG. 7 shows an example of a temperature schedule in firing the ceramic multi-layer wire substrate (electronic component) according to the sixth embodiment of the invention.

The plurality of green sheets provided with a certain wiring pattern were laminated and fired together. FIG. 7 shows an example of a temperature schedule in firing. As shown in FIG. 7, the firing was performed in the air atmosphere in a temperature rising process from the ambient temperature to 700° C., in a nitrogen atmosphere in a process in a temperature range from 700° C. to 900° C. (including maintaining time for 60 minutes at 900° C.), and again in the air atmosphere in a temperature dropping process from 700° C. to the ambient temperature. The temperature rising rate and the temperature dropping rate were set to 5° C./minute. The temperature schedule of firing is not limited to the schedule shown in FIG. 7. The nitrogen atmosphere was applied to the temperature range from 700° C. to 900° C. in order to restrict oxidation of particles 4 in the conductive paste.

(Evaluation of Multi-layer Wire Substrate)

An appearance test of the periphery of the wires 44(2) was performed. Generation of a gap or a change in color was not recognized at the surface boundary portion between the wires 44(2) and the ceramic substrate 42(3). Thus, a multi-layer wire substrate 41(1) was produced in a satisfactory appearance state. The specific resistances of the wires 44(2) and the through hole electrodes 43(2) were measured. As a result, values as designed which are similar to those in Example 2 in Table 1 were obtained. Then, a cross-section of the produced multi-layer wire substrate 41(1) was observed. As a result, the produced multi-layer wire substrate 41(1) was fired being sufficiently densified. It is thought that this caused the specific resistances to have satisfactory values as designed. It is thought that this is because debinding had substantially perfectly completed in the green sheets in the temperature rising process up to 700° C. Further it was confirmed that chemical reaction by the glass powder of the green sheets to the through hole electrodes 43(2) or the wires 44(2) had not occurred and gap had not been generated at the vicinity of the surface boundary therebetween. From the above, it was confirmed that electrode wires 2 (see FIG. 2) according to the invention can be applied as the wires 44(2) and the through holes 43(2) of the multi-layer wire substrate 41(1). As it is unnecessary to use electrode wires of an expensive silver thick film as the wires 44(2) and the through hole electrodes 43(2), electrode wires 2 (see FIG. 2) according to the invention can significantly contribute to reduction in cost.

In the foregoing embodiments, cases that an electronic component 1 is a solar battery cell 30, a plasma display panel 1, or a ceramic mounting substrate 41 has been described, however, an electronic component 1 is not limited thereto and the application scope of an electronic component 1 can be expanded to electronic components 1 to which an electrode wire 2 of aluminum can be applied.

REFERENCE SYMBOLS

1: electronic component
2: electrode wire
3: substrate
4: particle
4A: Particle Group A (first particle group)
4B: Particle Group B (second particle group)
5: oxide
5a: glass phase
5b: crystal phase (minute crystal)
6: necking joint portion
7: chemical compound layer

The invention claimed is:
1. An electronic component, comprising:
an electrode wire containing a plurality of particles formed from aluminum (Al) or a plurality of particles formed from an alloy containing aluminum, and an oxide for fixing the particles to a substrate,
wherein the oxide contains a glass phase,
wherein a chemical compound layer containing vanadium and aluminum is formed on a surface of the particles,
wherein the glass phase has a transition point lower than or equal to 290° C. and comprises vanadium, and
wherein the vanadium in the chemical compound layer and the glass phase contains vanadium atoms of different valences and at least 60 percent of the vanadium atoms have a valence of 4 or less.

2. The electronic component according to claim 1, wherein the chemical compound layer contains an alloy phase containing aluminum and zero valent vanadium.

3. The electronic component according to claim 1, wherein the chemical compound layer contains at least one of $Al_3V$, $AlV_3$, $Al_{0.8}Sb_{1.0}V_{0.2}O_4$, $Al_{0.5}Sb_{1.0}V_{0.5}O_4$, $AlV_2O_4$, $AlVO_3$, $VO_2AlO_2PO_2$, $Al_{0.02}V_{0.98}O_2$, and $Al_{0.07}V_{1.93}O_4$.

4. The electronic component according to claim 1, wherein the oxide contains phosphorus (P).

5. The electronic component according to claim 1, wherein the particles formed from an alloy containing aluminum contain at least one of silver (Ag), copper (Cu), calcium (Ca), magnesium (Mg), and silicon (Si).

6. The electronic component according to claim 1, wherein specific resistance of the electrode wire is $1\times10^{-4}$ Ωcm or lower.

7. The electronic component according to claim 1, wherein the oxide contains at least one of barium (Ba), tungsten (W), iron (Fe), manganese (Mn), antimony (Sb), bismuth (Bi), and tellurium (Te).

8. The electronic component according to claim 1, wherein the electronic component is any one of a display panel, a solar battery cell, and a ceramic mounting substrate.

9. An electronic component, comprising:
   an electrode wire containing a plurality of particles formed from aluminum (Al) or a plurality of particles formed from an alloy containing aluminum, and an oxide for fixing the particles to a substrate,
   wherein the oxide contains vanadium (V) with a valence of 4 or less and phosphorus (P), and at least one of boron (B), tungsten (W), iron (Fe), manganese (Mn), bismuth (Bi), and tellurium (Te),
   wherein the oxide contains a glass phase having a transition point lower than or equal to 290° C. and comprising vanadium, and
   wherein the vanadium contained in glass phase contains vanadium atoms of different valences where at least 60 percent of the vanadium atoms in the glass phase have a valence of 4 or less.

* * * * *